US 6,441,963 B2

(12) United States Patent
Murakami et al.

(10) Patent No.: US 6,441,963 B2
(45) Date of Patent: Aug. 27, 2002

(54) MULTI-LAYERED MIRROR

(75) Inventors: Katsuhiko Murakami, Kawasaki; Masayuki Shiraishi, Higashikurume, both of (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/867,191

(22) Filed: May 30, 2001

Related U.S. Application Data

(62) Division of application No. 09/391,376, filed on Sep. 8, 1999.

(30) Foreign Application Priority Data

| Sep. 8, 1998 | (JP) | 10-253484 |
| Jul. 14, 1999 | (JP) | 11-200272 |
| Jul. 21, 1999 | (JP) | 11-206837 |

(51) Int. Cl.[7] .......................... G02B 1/10; G21K 21/06
(52) U.S. Cl. .................. 359/584; 359/586; 359/580; 378/84; 378/85
(58) Field of Search ................. 359/580, 584, 359/585, 586, 589, 590, 359, 360; 378/84, 85; 372/5

(56) References Cited

U.S. PATENT DOCUMENTS

| 4,870,648 A | * | 9/1989 | Ceglio et al. ............ 372/5 |
| 5,239,566 A | | 8/1993 | Nakamura et al. ......... 378/43 |
| 5,265,143 A | * | 11/1993 | Early et al. ............. 378/84 |
| 6,134,049 A | | 10/2000 | Spiller et al. ............ 359/590 |
| 6,160,867 A | | 12/2000 | Murakami ................ 378/84 |

OTHER PUBLICATIONS

Louis et al., "Enhancement of reflectivity of multilayer mirrors for soft x–ray projection lithography by temperature optimization and ion bombardment," MicroElectronic Engineering 23 (1994), pp. 215–218.

Sun, "Internal stress in ion beam sputtered molybdenum films," J. Vac. Sci. Technol. A 4(3), May/Jun. 1986, pp. 572–576.

Hoffman et al., "Compressive stress and inert gas in Mo films sputtered from a cylindrical–post magnetron with Ne, Ar, Kr, and Xe," J. Vac. Sci. Technol. 17(1), Jan./Feb. 1980, pp. 380–383.

Carter et al., "The theory of ion beam polishing and machining," Vacuum, vol. 44, Nos. 3/4, 1993, pp. 303–309.

Schlatmann et al., "Modification by Ar and Kr ion bombardment of Mo/Si X–ray multilayers," Applied Surface Science 78 (1994), pp. 147–157.

(List continued on next page.)

*Primary Examiner*—Audrey Chang
(74) *Attorney, Agent, or Firm*—Morgan, Lewis & Bockius LLP

(57) ABSTRACT

A multi-layered mirror has a substrate, a first layer of a first substance, a second layer of a second substance. The refractive index of the first substance in a utilized wavelength region is different from that of the second substance. The first and second layers are laminated alternately on the substrate. To obtain a high reflectivity and superior optical characteristics, a multi-layered structure is formed within either the first layer or the second layer using at least two substances whose real parts of the complex indices of refraction in the utilized wavelength region are approximately the same. Alternatively, a layer surface is smoothed before forming a next layer thereon. An exposure apparatus that uses multi-layered mirrors of the present invention uses light with higher efficiency.

15 Claims, 16 Drawing Sheets

OTHER PUBLICATIONS

Louis et al., "Multilayer coated reflective optics for soft x–ray projection lithography," to be published in Proc. Micro– and Nano– Engineering 94, Sep. 1994.

Puik et al., "Two methods to improve the optical quality of Ni–C multilayer coatings: ion bombardment and optimization of the substrate temperature," SPIE vol. 1547, Multilayer Optics for Advanced X–Ray Applications (1991), pp. 221–227.

Bruijin et al., "Multilayer X–Ray Mirros; the State of the Art," SPIE Vol. 984, X–Ray Multilayers for Diffractometers, Monochromators, and Spectrometers (1988), pp. 54–63.

Spiller, "Smoothing of multilayer x–ray mirrors by ion polishing," Appl. Phys. Lett. 54 (23) (Jun. 5, 1989), pp. 2293–2295.

Puik et al., "Ion bombardment of thin layers: The effect on the interface roughness and its x–ray reflectivity (invited)", Rev. Sci. Instrum. 63(1), Jan. 1992, pp. 1415–1419.

Voorma et al., "Angular and energy dependence of ion bombardment of Mo/Si multilayers," J. Appl. Phys. 82(4) Aug. 15, 1997, pp. 1876–1881.

Spiller, "Enhancement of the Reflectivity of Multilayer X–Ray Mirrors by Ion Polishing," SPIE vol. 1160, X–ray/EUV Optics for Astronomy and Microscopy (1989), pp. 271–279.

Wasa et al., "Internal Stress in Mo/Si Multilayers," Autumn 1995, 56th Meeting of Japan Society of Applied Physics, Extended Abstracts, p. 491.

Kanehara et al., Thin Films, pp. 39–43.

Soyama et al., "Enhancement of Reflectivity of Multilayer Neutron Mirrors by Ion Polishing: Optimization of the Ion Beam Parameters," Journal of Physics and Chemistry of Solids 60 (1999), pp. 1587–1590.

Kinbara et al., Thin Films (4th ed., Oct. 30, 1982), pp. 39–43.

* cited by examiner

1: multi-layered mirror
2: substrate
3: multi-layered film

MULTI-LAYERED MIRROR

This is a divisional of application Ser. No. 09/391,376 filed on Sep. 8, 1999.

This application claims the benefit of Japanese Patent Application Nos.10-253484, 11-200272, and 11-206837, filed on Sep. 8, 1998, Jul. 14, 1999, and Jul. 21, 1999, respectively, all of which are hereby incorporated by reference.

BACKGROUND OF THE INVENTION

1. Field of the Invention

The present invention relates to a multi-layered mirror, a manufacturing method thereof, a stress control method thereof, and an exposure apparatus. More particularly, the present invention relates to a multi-layered mirror for X-rays or neutrons, such as X-ray apparatus including X-ray telescopes, X-ray lasers, and soft X-ray projection lithography.

2. Description of the Related Art

The complex index of refraction of a substance is expressed by the following equation:

$$n = 1 - \delta - i \cdot k \tag{1}$$

The $\delta$ and $k$ parameters are each quite small relative to unity in the X-ray region, so reflective optical systems are used in the X-ray region. Within Equation (1), $i^2 = -1$, and $k$ of the imaginary term indicates the absorption of X-rays by the substance.

Lenses utilizing refraction can not be used in the X-ray region since the difference between the refractive index of substances in the X-ray region and the refractive index of a vacuum (=1) is extremely small. Furthermore, even when reflection is used, reflectivity is very low.

Since the refractive index is slightly below 1, a high reflectivity is displayed when X-rays strike a smooth surface at a small grazing incidence tilt angle since total reflection occurs below an angle (critical angle of total reflection) determined by the refractive index. This type of mirror is called a "grazing incidence mirror."

However, the X-ray reflection angle of a grazing incidence mirror is greatly restricted. Therefore, such a grazing incidence mirror is deficient because it is impossible to construct an optical system with the multiple elements required for correction of aberration.

Accordingly, by using multiple reflecting surfaces and by keeping the X-rays reflected from each reflecting surface in phase, a multi-layered mirror with a high reflectivity was developed. This multi-layered mirror uses a film using a first substance with a small refractive index (a first layer) and a film using a second substance with a large refractive index (a second layer). The two types of films are alternately applied upon a substrate Whether the first substance layer or the second substance layer is adjacent to the substrate is not important. For example, a multi-layered mirror with molybdenum(Mo)/Silicon(Si) alternately multi-layered films has a reflectivity of 60% or greater for soft-X rays with 13 nm in wavelength and perpendicular incidence.

Because reflectivity is extremely small for nearly perpendicular incident angles that are even smaller than the totally reflecting limit angle $\theta c$ of a grazing incidence optical system, a reflective optical system used in the X-ray region uses a multi-layered film. Specifically, this type of multi-layered mirror is utilized in various fields of X-ray optics for applications such as X-ray telescopes, X-ray microscopes, X-ray reducing projection exposure devices, X-ray laser resonators, etc.

A multi-layered mirror used in such a reflective optical system is formed as laminated layers of two types of substances with high amplitude reflectivity at the interface. The thickness of each layer is determined based upon optical interference theory and is selected so that the waves reflected from each interface are in phase. Among the layered substances of such a multi-layered mirror, one substance has a small refractive index difference from vacuum (refractive index=1), and the other utilized substance has a large refractive index difference.

Since a multi-layered mirror can reflect X-rays perpendicularly, an optical system utilizing perpendicular reflection can have lower aberrations than a grazing incidence optical system utilizing total reflection. Furthermore, as indicated by Equation (2), a multi-layered mirror features wavelength selectivity since X-rays are strongly reflected only when the Bragg condition given below is satisfied:

$$2d \cdot \sin \theta = m \cdot \lambda, \tag{2}$$

where d is the multi-layered film periodic length, $\theta$ is the incident tilt angle, $\lambda$ is the X-ray wavelength, and m is the order.

Previously known examples of a multi-layered film used for a multi-layered mirror include a W/C multi-layered film prepared by alternately laminating layers of W (tungsten) and C (carbon) and Mo/C multi-layered film prepared by alternately laminating layers of Mo (molybdenum) and C. Such multi-layered films are formed by thin film growth technology such as sputtering, vacuum deposition, CVD (Chemical Vapor Deposition), etc.

Among the multi-layered films used for such multi-layered mirrors, the long wavelength side of the L absorption edge (12.6 nm wavelength) of Si of a Mo/Si multi-layered film has high reflectivity, and a comparatively good multi-layered film can be produced that has 60% or greater reflectivity (perpendicular incidence) in the vicinity of 13 nm wavelength. Mirrors utilizing this Mo/Si multi-layered film are used for research in X-ray telescopes, X-ray microscopes, X-ray reducing projection exposure devices, X-ray laser resonators, etc. It is anticipated that such mirrors will be used for reduction copying lithographic technology utilizing soft X-rays, which is called "EUVL" (Extreme Ultraviolet Lithography).

While the sputtering method has produced high reflectivity Mo/Si multi-layered mirrors, thin layers formed by the sputtering method are known to generally have internal compressive stress (Sey-Shing Sun, *Internal Stress in Ion Beam Sputtered Molybdenum Films*, J. Vac. Sci. Technol. A4 (3), May/June, 1986). When such internal stress occurs within a Mo/Si multi-layered film, the internal stress causes deformation of a substrate of a multi-layered mirror. This deformation causes wave front aberrations in the optical system, resulting in degradation of optical characteristics.

Since the refractive indexes of substances are also extremely near unity for a neutron beam, multi-layered mirrors are used for neutron beams in the same marner as X-rays. Although perpendicular reflection is impossible due to the short wavelength (high energy) of a neutron beam, the critical angle of total reflection can be increased by formation of a multi-layered film upon a surface of a grazing incidence mirror.

Furthermore, in addition to X-ray and neutron applications, a multi-layered mirror of the present invention can be used for ultraviolet light, visible light, and infrared light.

SUMMARY OF THE INVENTION

The present invention is directed to a multi-layered mirror that substantially obviates one or more of the above problems due to the limitations and disadvantages of the related art, a manufacturing method thereof a stress control method thereof and an exposure apparatus.

An object of the present invention is to provide a multi-layered mirror with increased reflectivity.

Other objects of the present invention are to provide a multi-layered mirror with a multi-layered film with a lower internal stress and to provide a method of controlling internal stress.

Still another object of the present invention is to provide a method for manufacturing a multi-layered mirror with increased reflectivity and/or reduced internal stress.

A further object of the present invention is to provide an exposure apparatus that uses light with higher efficiency.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve these and other advantages in accordance with the purpose of the invention, as embodied and broadly described herein, the invention includes a multi-layered mirror that has a substrate, at least one first layer of a first substance, and at least one second layer of a second substance. The at least one first and the least one second layer are laminated alternately on the substrate. A difference between a refractive index of the first substance in a utilized wavelength region and that in a vacuum is large. A difference between a refractive index of the second substance in the utilized wavelength region and that in a vacuum is small. Thicknesses of the first and second layers are determined according to the utilized wavelength and the refractive indices of the first and second substances, respectively. For at least one pair comprising two adjacent first and second layers, at least one of the layer within the pair has a multi-layered structure formed by alternately laminating to the thickness of that layer, at least two substances whose real parts of complex indices of refraction in the utilized wavelength are approximately the same.

In another aspect of the invention, a multi-layered mirror includes a substrate, at least one first layer of a first substance, at least one second layer of a second substance, and at least one stress-relief layer formed in at least one of the at least one first layer or the at least one second layer. The at least one first layer and the at least one second layer are alternately laminated on the substrate. A difference between a refractive index of the first substance in the soft X-ray wavelength region and that in a vacuum is large, and a difference between a refractive index of the second substance in the soft X-ray wavelength region and that in a vacuum is small. When the at least one stress-relief layer is formed in the at least one first layer, it has approximately a same real part of a complex index of refraction in the soft X-ray wavelength region as the first substance. When the at least one stress-relief layer is formed in the at least one second layer, it has approximately a same real part of a complex index of refraction as the second substance.

In another aspect, the invention includes a multi-layered mirror having a substrate, at least one layer of silicon, at least one layer of molybdenum, and at least one layer of ruthenium formed within at least one of the molybdenum layers. The at least one layer of silicon and the at least one layer of molybdenum are alternately laminated upon the substrate.

Yet another aspect of the invention includes a multi-layered mirror having a substrate, at least one first layer of a first substance with a small refractive index, at least one second layer of a second substance with a large refractive index. The at least one first layer and the at least one second layer are alternately laminated on the substrate by sputtering and an interface between the at least one first layer and the at least one second layer are irradiated by an ion beam and smoothed.

In a further aspect, the invention includes a multi-layered mirror having a substrate, a first layer of a first substance formed on the substrate, a second layer of a second substance formed on the first layer, a third layer of the first substance formed on the second layer, and a fourth layer of the second substance formed on the third layer. It also has a fifth layer of a third substance formed within a layer made with the first or the second substance. A difference in a refractive index in a utilized wavelength region and a refractive index in a vacuum of one of the first and second substances is large. A difference in a refractive index in a utilized wavelength region and a refractive index in a vacuum of the other substance is small. Thicknesses of the first and third layers are determined based on the utilized wavelength and a refractive index of the first substance, and thicknesses of the second and fourth layers are determined based on the utilized wavelength and a refractive index of the second substance. The third substance has approximately a same real part of a complex index of refraction in the utilized wavelength region as that of the layer within which the fifth layer is formed.

Another aspect of the invention includes a multi-layered mirror having a substrate, a first layer of a first substance formed on the substrate by sputtering, a second layer of a second substance formed on the first layer by sputtering, a third layer of the first substance formed on the second layer by sputtering, and a fourth layer of the second substance formed on the third layer by sputtering. A refractive index of the first substance is different from that of the second substance.

In another aspect, a method for manufacturing a multi-layered mirror on a substrate is provided. At least one first layer of a first substance with a small refractive index and at least one second layer of a second substance with a large refractive index are alternately laminated upon the substrate by sputtering. At least one of the at least one first layer or the at least one second layer is irradiated using an ion beam prior to forming another layer on top of that layer.

Another aspect of the present invention is a method of manufacturing a multi-layered mirror on a substrate. At least one first layer of a first substance and at least one second layer of a second substance are alternately laminated upon the substrate, where a difference between a refractive index of the first substance in the soft X-ray wavelength region and that in a vacuum is large and a corresponding difference for the second substance is small. At least one stress-relief layer is formed within at least one of the at least one first layer or the at least one second layer using a substance that has approximately a same size of a real part of a complex index of refraction as the substance of the layer within which it is formed. Particle beam irradiation is applied after forming of at least one of the at least one first layer, the at least one second layer, or the at least one stress relief layer.

In a further aspect, the invention includes a method of controlling stress of a multi-layered film formed upon a substrate by first laminating a first layer of a first substance on the substrate, applying particle beam irradiation on the first layer, and then laminating a second layer of a second substance on the first layer. The first substance and the second substance are different.

Finally, in another aspect, the invention includes an exposure apparatus that has an X-ray source for generating X-rays, an illumination optical system capable of directing X-rays from the X-ray source to an X-ray mask, and a projection optical system capable of directing X-rays from the X-ray mask to a photo-sensitive substrate so that a pattern of the X-ray mask is copied to the photo-sensitive substrate. The illumination optical system and the projection optical system are equipped with multi-layered mirrors, at least one of which is a multi-layered mirror of the present invention.

It is to be understood that both the foregoing general description and the following detailed description are exemplary and explanatory only are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention in the drawings.

DESCRIPTION OF THE PREFERRED EMBODIMENT

Reference will now be made in detail to the preferred embodiments of the present invention, examples of which are illustrated in the accompanying drawings. Wherever possible, the same reference numbers will be used throughout the drawings to refer to the same or like parts.

It is known that substrate deformation becomes a problem due to internal stress of a multi-layered film when a Mo/Si multi-layered film is used as a mirror. It is also known that this internal stress can be lowered by increasing the number of layers while maintaining a fixed total film thickness of a multi-layered film and by decreasing the film thickness of each layer. (W. Wasa, S. Miwa, and K. Murakami, *Internal Stress of a Mo/Si Multi-Layered Film,* 56th Collection of Lecture Preprints of the Japan Society of Applied Physics, Vol.2, 1995). Using the method of increasing the number of layers by reducing thicknesses of various films, the periodic length (in case of a Mo/Si multi-layered film, the thickness of a pair of layers comprising an adjacent Mo and Si layers) of a multi-layered film decreases. Thus, this method can not be applied to a multi-layered mirror with a designated utilized wavelength.

In the present invention, internal stress is lowered without altering a periodic length of a multi-layered film. The following two methods are used to decrease internal stress of a multi-layered film: (1) a first method increases the number of interfaces of the multi-layered film by replacing an arbitrary layer (of a certain substance) of the multi-layered film with a multiple layer including the certain substance and a substance with the same δ optical constant as that of the certain substance; (2) a second method irradiates the layer surface with a particle beam as a multi-layered film is formed.

Figure 1A:
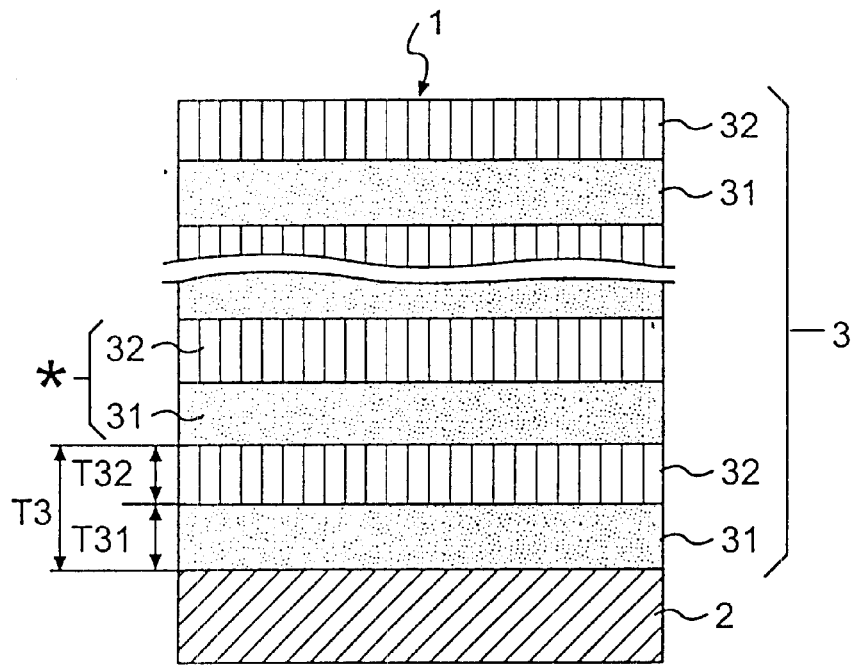
FIGS. 1(a) and (b) are cross-sectional diagrams of one embodiment of a multi-layered mirror of the present invention.
Figure 1B:
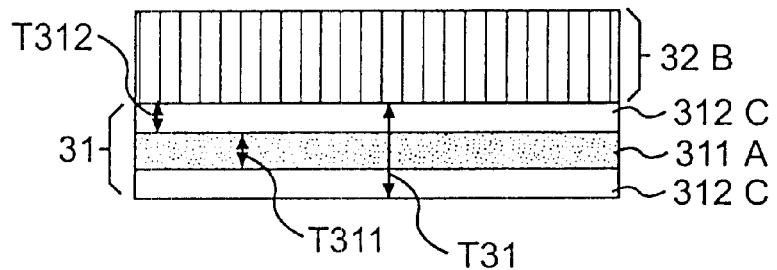

FIG. 1 is a diagram that explains a multi-layered mirror utilizing the first method. FIG. 1(a) is a cross-sectional diagram of a multi-layered mirror 1, and FIG. 1(b) is an expanded view of a portion thereof. The multi-layered mirror 1 is formed from a multi-layered film 3 that is constructed by laminating alternating layers 31 and 32 by sputtering upon a substrate 2, such as a glass substrate, a silicon substrate etc. These alternating layers consist of the layers 31 and 32, which are formed from different substances. Within the multi-layered film 3, if the layers 31 are taken to be heavy atom layers, the layers 32 are light atom layers. As explained below, the layers 31 of the multi-layered mirror 1 have a multi-layered structure comprising different substances. Although a prior art multi-layered mirror, such as a Mo/Si multi-layered film, consists of a Mo layer 31 and a Si layer 32, each layer consists of a single substance. The sum T3 of the layer 31 thickness T31 and the layer 32 thickness T32 is equal to T31+T32, which is equal to the periodic length of the multi-layered film 3.

FIG. 1 (b) is a magnified view of a layer pair (one layer 31 and one layer 32) indicated by the * symbol in the multi-layered film 3 in FIG. 1(a). Although the layer 32 is formed using a single substance B (32(B)), the layer 31 has a three-layer structure consisting of a layer 311 of substance A (311(A)) and layers 312 of substance C (312(C)). The substances A and C are selected so that δa and δc have approximately a same size, where the substance A has a complex refractive index at the utilized wavelength of na=1−δa−i·ka, and where the substance C has a complex refractive index of nc=1−δc−i·kc.

For example, in prior art, a Mo/Si multi-layered film was used for a 13 nm utilization wavelength. The Mo layer of this prior art Mo/Si multi-layered film uses Si as substance B and Mo as substance A. To form a multi-layered structure in FIG. 1(b), a substance that has a δ optical constant similar to that of Mo, such as Ru (ruthenium) may be used for substance C. If the layer thickness of the layer 311 is T311, and the layer thickness of the layer 312 is T312, T31 is given by Equation (3):

$$T31=T311+2·T312 \quad (3)$$

The total number of interfaces of the above mentioned multi-layered film 3 increases due to the multi-layered structure of the layer 31, thereby making it possible to reduce internal stress of the multi-layered film 3. In contrast to a Mo/Si multi-layered film in prior art, the Ru layer 312 within the layer 31 functions as a stress-relief layer that relieves internal stress of the multi-layered film. Since substance A (that forms the layer 311) and substance C (that forms the layers 312) have approximately a same size of the optical constant δ, the three-layer structure layer 31 has a thickness T31 and can be regarded as a single heavy atom layer. The periodic length T3 indicates the sum of the layer thickness T31 and the layer thickness T32 (of the light atom layer). Even though the number of interfaces of the multi-layered film 3 has increased, the multi-layered film 3 has the same periodic length as one that is formed from a single substance A.

FIG. 1(b) shows layers that were laminated on the substrate 2 in the following order: the layer 312, the layer 311, and the layer 312. However, they can also be laminated in the following or order: the layer 311, the layer 312, and the layer 311. These layers are also not restricted to a three-layer structure. Furthermore, a multi-layered structure like that of FIG. 1(b) can be utilized by either some of the layers 31 or by all of the layers 31 of FIG. 1(a). Although FIG. 1 shows the layer 31 with a multi-layered structure, it is also permissible for both the layers 31 and the layers 32 to have a multi-layered structure. Alternatively, the layer 32 alone may have a multi-layered structure. If the layer 32 has a multi-layered structure, and if substance B is Si, a substance that has a δ optical constant near that of Si in the vicinity of 13 nm wavelength, such as a Si compound, barium (Ba), etc., is used.

Table 1 lists examples of substances with a large δ value and substances with a small δ value at utilization X-ray wavelengths of 13 nm and 10.9 nm. For example, at 13 nm utilization X-ray wavelength, permissible examples of substance C of the layer 312 are Ru, Tc (technetium), and Rh (rhodium), when the layer 311 of the layer 31 of FIG. 1(b) is Mo.

Figure 2C:
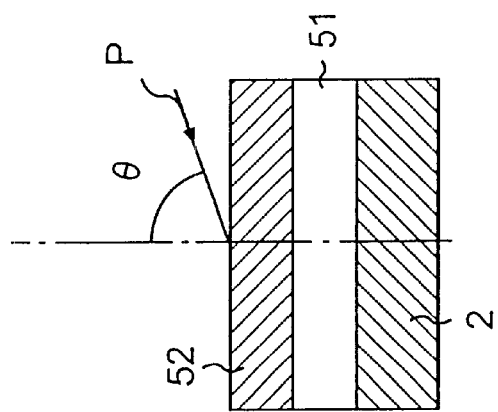
FIGS. 2(a) and 2(b) and 2(c) are explanatory drawings of one example of a method of manufacturing a multi-layered mirror by irradiation using a particle beam P during multi-layered film formation stage.
Figure 2B:
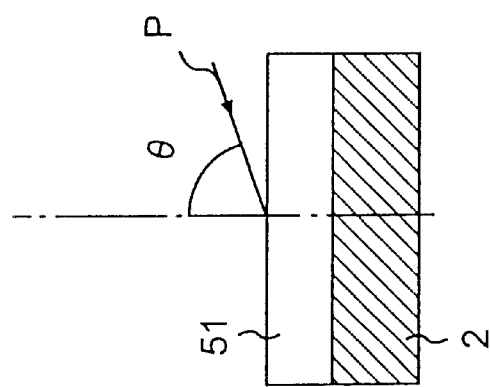
Figure 2A:
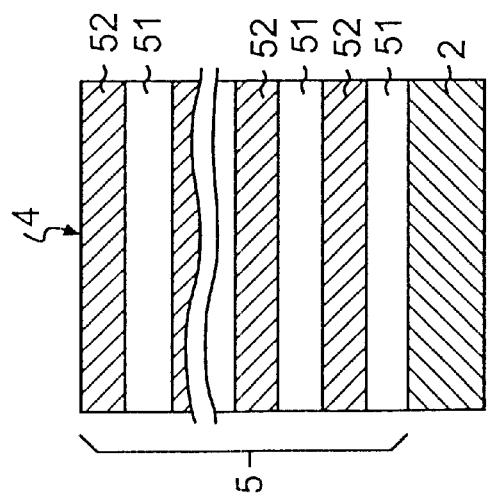

Next, the second method is explained using FIG. 2. FIG. 2(a) is a cross-sectional drawing of a multi-layered mirror 4. Like the multi-layered mirror 1, layers 51 and layers 52 of the multi-layered mirror 4 are alternately laminated by sputtering on the substrate 2 to form a multi-layered film 5. Both layers 51 and layers 52 consist of a single substance. For example, if the layer 51 is a heavy atom layer formed from Mo, etc., then the layer 52 is a light atom layer formed from Si, etc.

FIGS. 2(b) and 2(c) illustrate one embodiment of a method of forming the multi-layered film 5. Specifically, FIGS. 2(b) and 2(c) show steps of forming layer 52 on layer 51. Layer 51 is formed upon the substrate 2 by sputtering. Then, as shown in FIG. 2(b), the surface of layer 51 is irradiated by a particle beam P (such as an Ar ion beam, etc) at an irradiation angle θ. After the surface of layer 51 is irradiated to a certain extent by the particle beam P, layer 52 is formed by sputtering. Thus, the surface of layer 51 irradiated by the particle beam P becomes an interfacial surface between layer 51 and layer 52. Layer 52 is formed upon layer 51 in the same manner as layer 51. After the formation of layer 52 on layer 51, the surface of layer 52 is irradiated by the particle beam P as illustrated in FIG. 2(c). Then the remaining layers 51 and 52 of the multi-layered film 5 are formed in the same manner.

Our experiments confirmed that internal stress of the multi-layered film 5 was decreased when a layer surface was irradiated by the particle beam P prior to formation of an adjacent layer as described above. This type of internal stress reduction is thought to be due to the following reasons. When a surface of a layer formed by sputtering, etc. is irradiated by a particle beam, it is thought that the condition (for example, micro-scale concavities-protuberances, atomic voids, atomic arrangement) of the layer surface is improved, thereby affecting internal stress of the multi-layered film. In particular, irradiation of a multi-layered film interface by an argon particle beam is thought to affect the atomic arrangement within the film so as to form voids, to relieve the atomic structure, etc. These effects are thought to lower compressive stress.

When the inventors of the present invention varied an irradiation angle of a particle beam relative to a line perpendicular to the interface surface of a multi-layered film, stress existing within the film was found to change. Table 2 shows changes in layer stress with respect to changes in an irradiation angle of a particle beam. It is assumed that each of the films has nearly the same internal stress prior to particle beam irradiation. Particle beam irradiation time and the unit surface area particle count were kept the same for each film.

The desired layer stress can be obtained in this manner by controlling a particle beam irradiation angle relative to an interface surface of a multi-layered film. It is also possible to prevent deformation of a substrate that results from film stress.

In general, it does not matter which layers of a multi-layered film are irradiated by a particle beam. In FIG. 2, any of the layers 51 and 52 may be irradiated by the particle beam P. Similarly, for a multi-layered mirror in FIG. 1 whose layer 31 comprises the layers 311 and 312, the layers 311 and 312 can be irradiated by the particle beam P. When the layers 311 and/or 312 have a multi-layer structure, irradiation by a particle beam results in a much larger reduction in internal stress. In any case, the use of a particle beam decreases internal stress of any multi-layered film.

Figure 8:
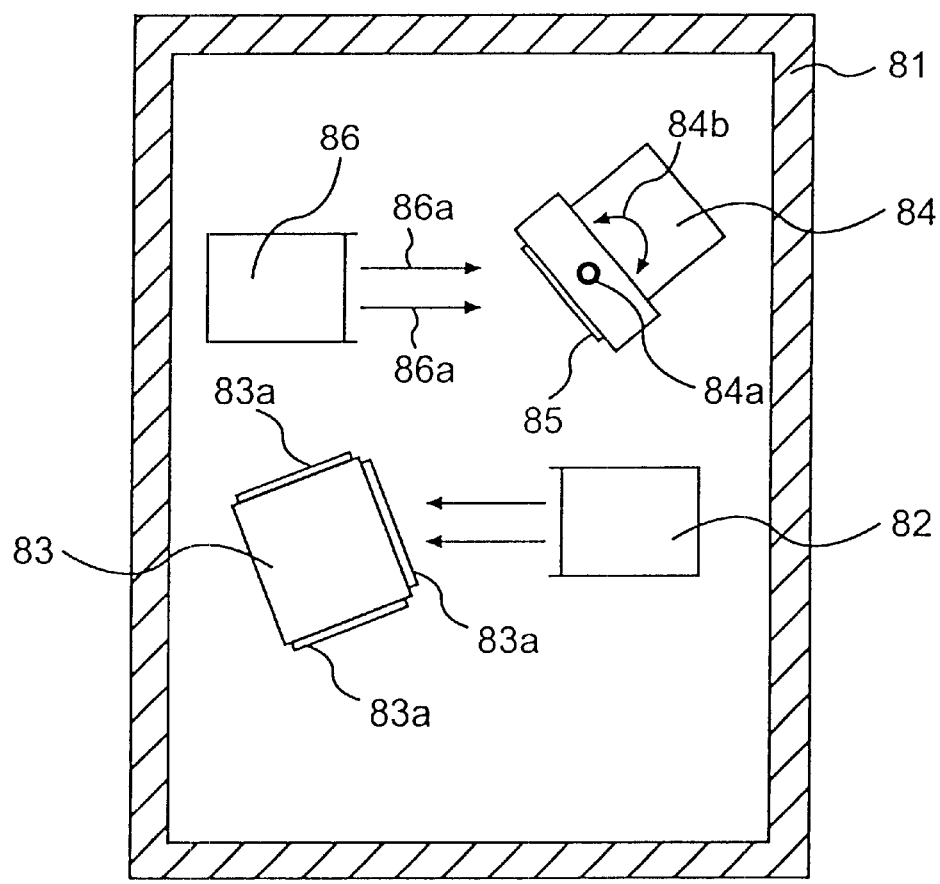
FIG. 8 is a schematic drawing showing an ion sputtering apparatus used in forming a multi-layered mirror of the present invention.

FIG. 8 shows an ion sputtering apparatus used in forming multi-layered mirrors of the present invention, included preferred embodiments of the present invention. This ion sputtering apparatus is equipped with a vacuum chamber 81 which contains a sputtering ion source 82, a target 83a (which is a deposited substance), a target holder 83 (which holds the target 83a in place within the vacuum chamber 81), and a substrate holder 84 (which holds a substrate 85 in place during film deposition thereupon). A stress control particle beam source 86 is also provided to emit a particle beam toward the deposited film.

An angle adjustment mechanism of the substrate holder 84 can change the incident angle of a particle beam 86*a*. Specifically, this angle adjustment mechanism is equipped with a rotation shaft 84*a* that alters the incident angle upon the substrate 85 of the particle beam 86*a* emitted from the stress control particle beam source 86. The substrate holder 84 is constructed so as to be capable of rotation in the 84*a* direction centered upon the rotation shaft 84*a* as indicated by the arrows 84*b* in FIG. 8. The substrate holder 84 is rotated during sputtering to adjust the substrate holder 84 toward the incoming direction of the deposited substance. When the deposited film interface is irradiated by the particle beam 86*a* to reduce stress, the substrate holder 84 is rotated and positioned so that the surface of the substrate 86 is directed toward the stress control particle beam source 86.

Moreover, the target holder 83 is also capable of rotation, and targets of different substances can be positioned at respective surfaces of the target holder 83. As the target holder 83 rotates, ions can be produced by the sputtering source 82 from the desired target 83*a* so that a layer of the desired substance can be deposited upon the substrate 85.

Figure 3:
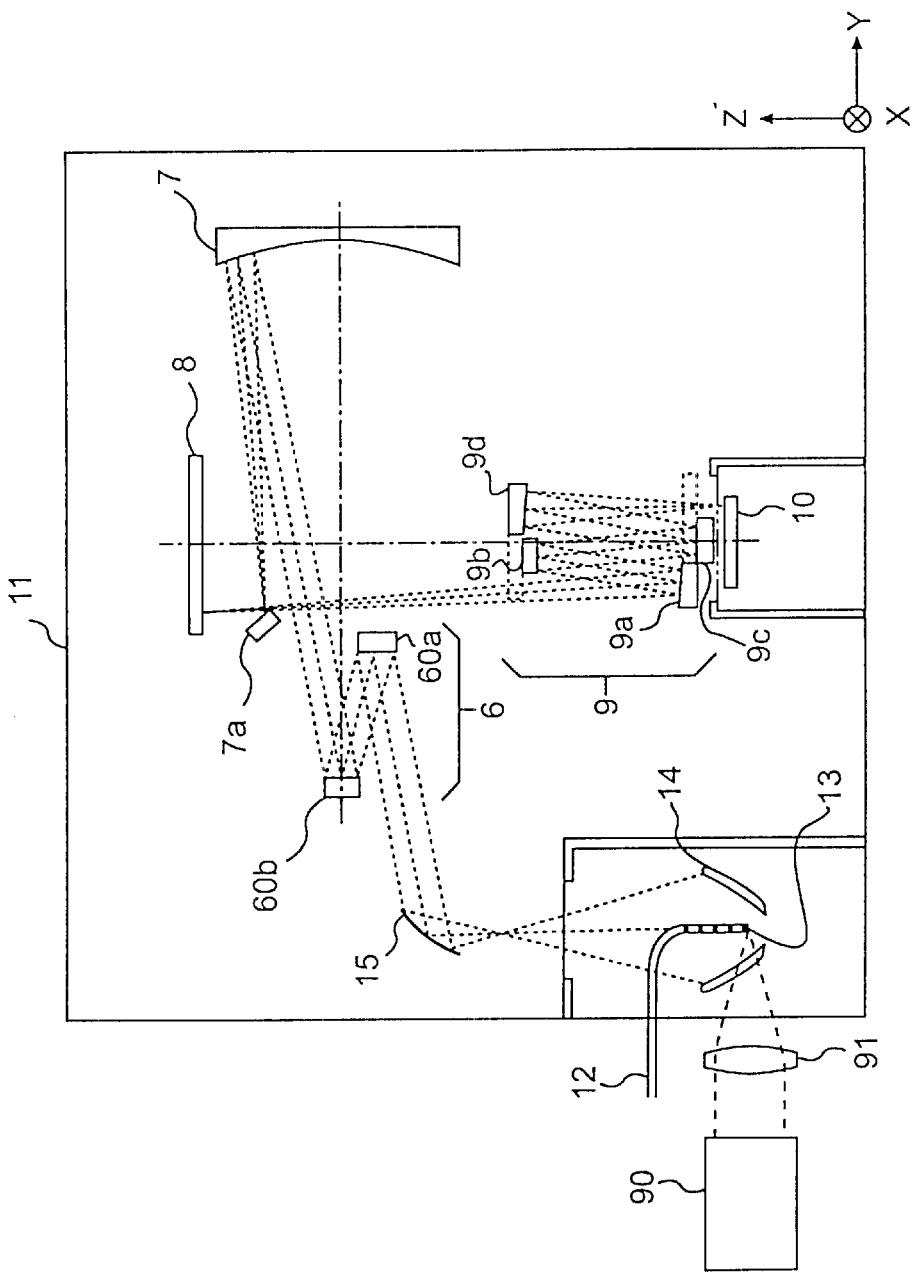
FIG. 3 is a schematic drawing that shows one embodiment of an exposure apparatus that utilizes multi-layered mirrors of the present invention as an optical system.

Next, use of the above mentioned multi-layered mirrors 1, 4 in an optical system of a reducing projection exposure apparatus is explained. FIG. 3 shows the essential components of one embodiment of an exposure apparatus of the present invention. This exposure apparatus is a projection exposure apparatus that carries out exposure movement by the step-and-scan method. While a portion of the image of the circuit pattern drawn upon a reflection type mask 8 is projected by a projection optical system 9 upon a wafer 10, the mask 8 and the wafer 10 are made to move one-dimensionally (in Y-axis direction in this case) relative to the projection optical system 9. During this step-and-scan method, multiple narrow regions are each copied individually from over the entire circuit pattern of the mask 8 to the wafer 10. Furthermore, the light path traversed by soft X-rays used for exposure is shielded by a vacuum chamber 11 from the external atmosphere, since the soft X-rays used for exposure are strongly absorbed by the atmosphere.

A pulsed laser light source 90 emits laser light in the infrared to visible wavelength region. For example, a semiconductor laser-activated YAG laser or excimer laser is used as the laser light source 90. This laser light is concentrated at a position 13 by an optical system 91 and illuminates a gaseous substance emitted by a nozzle 12. Illumination of the substance by laser light excites the substance into a plasma state due to energy of the laser light. Soft X-rays are emitted during transition from this excited state to a lower energy state.

An ellipsoidal mirror 14 placed at the periphery of the position 13 is formed from a multi-layered film in order to reflect soft X-rays. The ellipsoidal mirror 14 is positioned so that the first focal point nearly coincides with the position 13. Soft X-rays reflected by the ellipsoidal mirror 14, after concentrating once at the second focal point, strike a paraboloidal mirror 15. The paraboloidal mirror 15 is positioned so that its focal point nearly coincides with the second focal point location of the ellipsoidal mirror 14. The reflective surface of the paraboloidal mirror 15 is formed from a multi-layered film that reflects soft X-rays.

In a nearly collimated state, soft X-rays reflected from the paraboloidal mirror 15 enter a reflective fly's-eye optical system 6, which is used as an optical integrator. The reflective fly's-eye optical system 6 comprises multiple reflective surfaces (multiple mirror elements) of a first reflective element group 60*a* and a second reflective element group 60*b* (with multiple reflective surfaces that correspond to the opposing multiple surfaces of the first reflective element group 60*a*). Upon these multiple reflective surfaces that comprise these reflective element groups 60*a* and 60*b*, multi-layered films that reflect soft X-rays are formed.

Collimated soft X-rays reflected from the paraboloidal mirror 15 undergo wave front splitting due to the first reflective element group 60*a*. Soft X-ray lights from various reflective surfaces are concentrated to form multiple light source images. The multiple reflective surfaces of the second reflective element group 60*b* are positioned close to the positions where each respective image of these multiple light source images is formed. These reflective surfaces substantially perform the function of field mirrors. In this manner, the reflective fly's-eye optical system 6 uses a nearly parallel light beam from the paraboloidal mirror 15 to form a two-dimensional light source as multiple light source images.

X-rays from the two-dimensional light source formed by the reflective fly's-eye optical system 6 strike a condenser mirror 7 that has a focal point location near the two-dimensional light source. After reflected light from the condenser mirror 7 is concentrated, this light illuminates the reflective mask 8 through an optical path deflection mirror 7*a*. As the reflective mask 8 is illuminated, the condenser mirror 7 concentrates soft X-rays upon the mask 8 from the above mentioned two-dimensional light source. A certain illumination region upon the mask 8 is illuminated uniformly and satisfactorily. The mirrors 7 and 7*a* are formed as multi-layered films that reflect soft X-rays.

The illumination system of the exposure apparatus in FIG. 3 is a non-telecentric optical system so that the illuminating light directed toward the reflective mask 8 and the exposure light reflected from the mask 8 and directed toward the projection optical system 9 undergo spacial light path separation. The projection optical system also is a mask-side non-telecentric optical system.

A reflective film pattern is provided upon the reflective mask 8 that reflects soft X-rays from a multi-layered film. This reflective film pattern corresponds to the pattern that should be copied upon the wafer 10. The X-rays that contain pattern information reflected by the mask 8 then enter the projection optical system 9.

The projection optical system 9 of the present working embodiment is constructed from a total of four mirrors: a first mirror 9*a* with a concave surface, a second mirror 9*b* with a convex surface, a third mirror 9*c* with a convex surface, and a fourth mirror 9*d* with a concave surface. Each of the mirrors 9*a*–9*d* is formed as an X-ray reflecting multi-layered film upon a substrate. These mirrors are placed so that their optical axes coincide.

Furthermore, the first mirror 9*a*, the second mirror 9*b*, and the fourth mirror 9*d* are trimmed so that none of the mirrors 9*a*–9*d* blocks the back-and-forth optical path. Moreover, an aperture stop (not shown in the drawing) is provided at the position of the third mirror 9*c*.

Soft X-rays reflected from the mask 8 are reflected in turn by the first mirror 9*a* through the fourth mirror 9*d*, then form a reduced image of the mask 8 pattern within the exposure region upon the wafer 10 at a certain magnification $\beta$ (for example, $\beta = \frac{1}{4}, \frac{1}{5}$, or $\frac{1}{6}$). This projection optical system 9 is constructed so that the image side (the wafer side) becomes telecentric.

Although not shown in FIG. 3, the mask 8 is supported by at least one reticle stage that is movable along the Y direction, and the wafer 10 is supported by a wafer stage that is movable along three (X, Y, and Z) directions. During the exposure operation, the mask 8 and the wafer 10 are moved in opposite directions at a certain speed ratio determined by the reduction (magnification of the projection optical system 9. Scanning exposure of the mask 8 pattern by this means takes place within a certain shot region upon the wafer 10.

The reflective surfaces (the ellipsoidal mirror 14, the paraboloidal mirror 15, the reflective fly's-eye optical system 6, the reflective elements groups 60*a* and 60*b*, the condenser 7, the mirror 7*a*, the mirrors 9*a*–9*d*, and the reflective mask 8) were formed as multi-layered films. These multi-layered films use the preferred embodiments in FIGS. 1 and 2. By using such multi-layered mirrors, stress is reduced without decreasing reflection magnification As a result, the degree of deformation of each mirror due to stress can be controlled. This can prevent worsening of aberrations and can achieve higher throughput.

Prior art technology suffers from a problem that reflectivities of actually manufactured multi-layered mirrors are lower than those predicted by calculations. This problem worsens as the wavelength of a reflected object becomes shorter. The inventors of the present invention thought that the major cause of this problem was due to roughness of the interfaces (i.e. interfaces between the first layers and the second layers) of a multi-layered film.

Lowering of reflectivity due to multi-layered mirror interface roughness is given by Equation (3) below:

$$R/R_0 = \exp[-\{(4\pi\sigma \sin \theta)/\lambda\}^2] \quad (3)$$

where,
- R: calculation-based theoretical reflectivity of a multi-layered mirror,
- $R_0$: reflectivity of an actually manufactured multi-layered mirror,
- σ: mean square value of the interface roughness;
- θ: incidence tilt angle (angle of incidence measured from the reflective surface, not from normal); and
- λ: wavelength of the reflected object.

The inventors also thought that reflectivity decreases because of a decline in contrast of indexes of refractivity due to formation of inter-diffusion layers on a surface.

Interface roughness of a multi-layered mirror can not be decreased if surface roughness of a substrate of a multi-layered film is not sufficiently small. Therefore a substrate is used that has been polished so that the RMS surface roughness of the substrate of the multi-layered mirror is 0.1 to 0.3 nm.

Under prior art technology, however, even using such an extremely smooth substrate during formation of a multi-layered film upon this substrate produces interface roughness of the multi-layered film of a value greater than the surface roughness of the smooth substrate.

This occurs because, when each layer (the first and the second layers) of the multi-layered film is formed upon the smooth substrate, growth morphology of the layer is not entirely the same as that of the underlying material (i.e. the smooth substrate).

It is widely known that deposited atoms upon the substrate surface move about upon the surface during the thin film growth process. These atoms gather together into growth nuclei that form and break apart. After the growth nuclei exceed a certain size, these growth nuclei become stable and grow larger.

Therefore, transient islands of growth appear during the initial step of thin film growth After the film has grown to a certain thickness, these initial island structures become linked together, and the initial islands become a continuous thin film (for example, see Akira Kinbara and Hideo Fujiwara, *Thin Film*, Applied Physics Series, vol. 3, 1979).

This type of growth process greatly depends upon kinetic energy of atoms striking the substrate. In comparison to the relatively low kinetic energy (less than 0.1 eV) vapor deposition method, a thin film with low surface roughness is obtained by high kinetic energy sputtering (several tens of eV) that is continuous even when the film is thin.

A multi-layered mirror used for X-rays or neutron beams has alternatively laminated layers with thicknesses of each layer as small as several nm or several tens of nm, which is about the same level as one at which non-continuous islands become a continuous thin film.

Therefore, the initial growth time period for each layer has a very strong effect upon interface roughness. A reflectivity of a multi-layered mirror manufactured by the sputtering method is usually higher than that of a multi-layered mirror manufactured by the vapor deposition method.

In order to lower interface roughness of a multi-layered mirror manufactured by vapor deposition method, research is being carried out on the use of ion beam polishing of the surface after formation of each layer.

For example, an article by E. Spiller reports that when ion beam polishing is applied to a Rh/C multi-layered film produced by vapor deposition, a reflectivity roughly doubled at 4.8 nm wavelength in comparison to a multi-layered film without such ion polishing. (E. Spiller, *Smoothing of Multilayer X-ray Mirrors by Ion Polishing*, Appl. Phys. Let 54(23) (June 1989)).

In addition, there have been many reports on multi-layered films produced by combining the vapor deposition method and ion beam polishing.

However, even when such methods are used, the resultant reflectivity has been less than (or equal to) that of a multi-layered mirror produced by the sputtering method.

By combining the sputtering method, which can be used to obtain higher reflectivities than the vapor deposition method, and ion beam polishing, the inventors of the present invention produced a multi-layered mirror with an even higher reflectivity than those manufactured using the sputtering method in prior art.

In other words, a multi-layered mirror is manufactured by alternatively laminating by sputtering upon a substrate, a layer of a first substance with a relatively small refractive index (a first layer) and a layer of a second substance with a relatively large refractive index (a second layer) as follows:

(1) after formation of the first layer, and prior to formation of the second layer, a smoothing step is carried out by irradiation of the surface of the first layer using an ion beam; or (2) after formation of the second layer, and prior to formation of the first layer, a smoothing step is carried out by irradiation of the surface of the second layer using an ion beam; or (3) perform both (1) and (2).

Thus, the present invention can be used to obtain a multi-layered mirror with a reflectivity higher than that of prior art.

One preferred embodiment of the present invention regarding a manufacturing method of a multi-layered mirror is now described. First, a substrate that has been polished to sufficient smoothness is prepared. As long as the surface is smooth, no particular limitations are placed upon a substrate material. Examples of a substrate material include glasses (quartz, etc.), silicon, or silicon carbide.

Next, the sputtering method is used to form a substance A layer (i.e. either the first substance layer or the second substance layer) upon the surface of the substrate. Here, the sputtering method is carried out by causing accelerated inert gas ions (argon, etc.) to collide with a plate-shaped component (referred to as a target). This kinetic energy causes evaporation of the target material atoms.

Because the vapor deposition method uses heat to evaporate material, the kinetic energy (as determined by the heating temperature) is less than 0.1 eV. Because atoms of the target material are knocked away by collision energy of the ions during the sputtering method, the resultant kinetic energy is several eV to several tens of eV, which is far higher than one obtained by the vapor deposition method.

Therefore, atoms deposited upon the substrate using the sputtering method move much more on the substrate surface than those deposited using the vapor deposition method. Using the sputtering method, the atoms arrive at more stable positions, resulting in a surface with less unevenness.

Figure 10A:
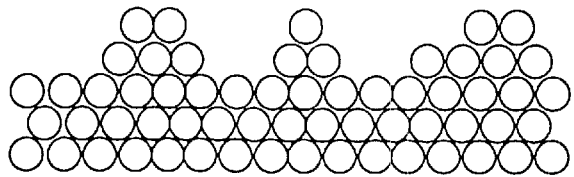
FIGS. 10(a)–(e) show examples of various conditions of a multi-layered film interface in order to explain effects of the present invention.
Figure 10B:
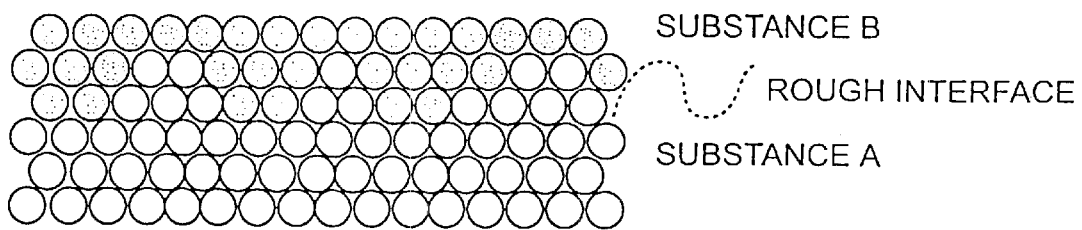

However, even when the sputtering method is used, the post-formation thin film surface, as shown in FIG. 10(a), is not entirely flat on the atomic level and has localized unevenness. Conceptual drawings these atoms are provided in FIG. 10. The white dots correspond to atoms that form a substance A, and the black dots correspond to atoms that form a substance B.

When the substance B layer is formed by sputtering upon the substance A layer, where the substance A and the substance B are difficult to mix together, the substance B atoms attach so as to bury unevenness formed on the surface of the thin film formed from the substance A. A rough interface forms as showing in FIG. 10(b).

Figure 10C:
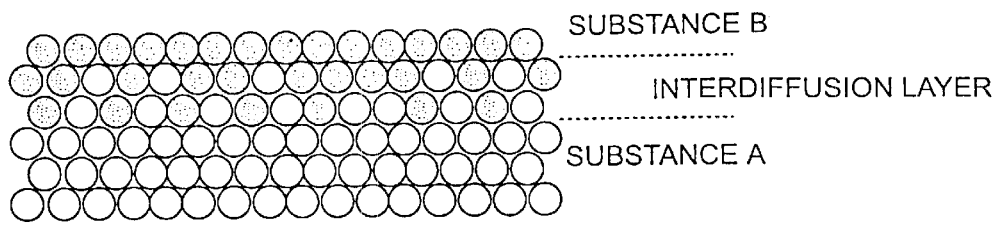

When the substance A and the substance B mix together readily, unevenness within the thin film surface formed from the substance A forms an inter-diffusion layer. Because there is only a small number of the substance A atoms at the perimeter of an irregularity, the substance A has a tendency to diffuse into the substance B as illustrated in FIG. 10(c).

In practice, these two phenomena occur simultaneously so as to form a complex interface. As a result, interface roughness and inter-diffusion layers become the major causes of worsening of reflectivity of multi-layered mirrors.

In one preferred embodiment of the present invention, after formation of the substance A layer, its surface is smoothed by irradiation using ions of an inert gas such as argon, xenon, or krypton. An inert gas is used because it does not react chemically with the thin film surface and only imparts kinetic energy.

Figure 10D:
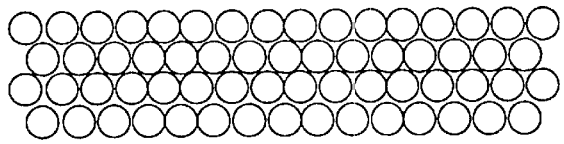
Figure 10E:
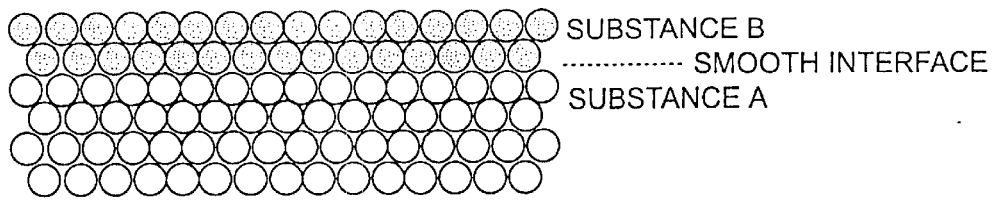

When a thin film surface shown in FIG. 10(a) is irradiated b as ions, atoms that form protuberances are removed by collisions. Alternatively, atoms that form protuberances are imparted kinetic energy for movement across the substrate surface and move to concavities. Thus, the surface can be made smooth as shown in FIG. 10(d). FIG. 10(e) shows smooth interface between the substance A layer and the substance B layer, when the substance B layer is formed upon the substance A layer that has been irradiated by an ion beam.

The utilized ion element type, incident energy, and an angle of incidence become important parameters during this process. These parameters are preferably optimized for each or respective substance that forms alternately multi-layered films of a multi-layered mirror. For example, the incident energy is preferably within the range of 50 eV to 1000 eV.

Moreover, to dissipate the charge of the incident ions, the substrate should preferably be grounded or a DC bias potential should be applied to the substrate.

Generally, kinetic energy of ions emitted by the ion source can not be greatly varied. Therefore, the available energy range of ions striking the substrate can be broadened by applying a bias to the substrate.

When a multi-layered mirror is produced by a manufacturing method of the present invention, such as the preferred embodiment described above, both interface roughness and the inter-diffusion layer, which are major causes of worsening of reflectivity of the multi-layered mirror, can be reduced or eliminated. Thus, it becomes possible to obtain a multi-layered mirror with higher reflectivity than that of prior art.

Furthermore, as explained above, when ion beam polishing of each layer is carried out, ion beam polishing is preferably carried out so that $\sigma_{int}$, which is defined as an RMS value of roughness of the interface between the first layer and the second layer, should be kept within the range indicated below. For example, when a periodic length, which is defined as the sum of the first layer thickness and the second thickness, is 5 nm or greater, polishing is preferably carried out so that $\sigma_{int}-\sigma_{sub}<0.2$ nm, where $\sigma_{rub}$ is an RMS value of surface roughness of the substrate.

As an example, a multi-layered mirror whose first substance is silicon and whose second substance is molybdenum is considered using a utilization wavelength of 13.5 nm. The periodic length of a multi-layered film using molybdenum and silicon at this wavelength for nearly perpendicular angle of incidence is 6.8 nm. In contrast to the theoretical reflectivity value of 73%, a multi-layered mirror that is actually manufactured using molybdenum and silicon has a reflectivity of only 67%.

As mentioned above, a substrate can be used with an RMS surface roughness value of 0.1 nm. As each layer is formed upon the surface of this substrate, interface roughness of each layer is determined by the substrate surface roughness and roughness caused by film formation. Thus, the interface roughness is at least as large as the roughness of the surface of the substrate. However, if ion beam polishing is carried out in the above mentioned manner after formation of each layer, the roughness component that arises during film formation can be removed by ion beam polishing, and thus the RMS roughness value can be decreased below 0.3 nm for the film surface after film formation.

Figure 11:
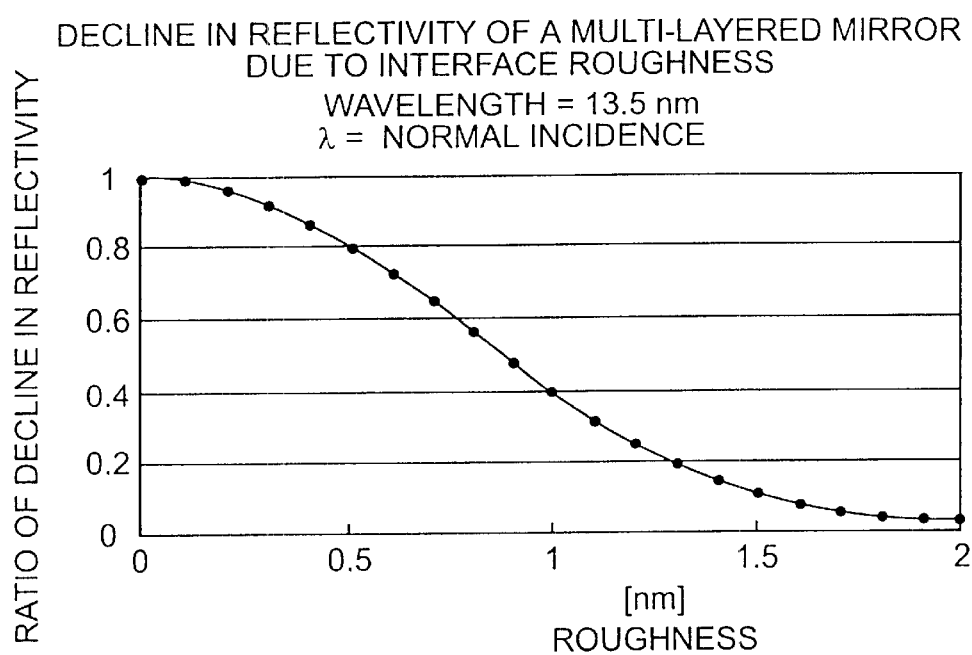
FIG. 11 is a graph showing a ratio of decline in reflectivity and interface roughness for a multi-layered mirror with a period length greater than 50 Å.

FIG. 11 shows variations of a ratio of decline in reflectivity with respect to multi-layered mirror interface roughness at perpendicular angle of incidence and 13.5 nm wavelength When the interface RMS roughness value is 0.3 nm, an 8% decline in reflectivity is obtained in comparison to an interface RMS roughness value of 0. Then if an interface is obtained with an even lower RMS roughness value, a multi-layered mirror can be obtained with a high reflectivity in comparison to the prior art.

In particular, this wavelength region is that of light used by an exposure apparatus described below. Because at least two mirrors are needed for an exposure apparatus, even a small improvement in reflectivities of individual mirrors can markedly increase the intensity of light remaining after reflection from all the mirrors.

For example, if the reflectivity R of a single mirror is improved by $\Delta R$, the overall reflectivity (transmittance) of an optical system comprising n mirrors is given by Equation (3) below:

$$R^n \to (R+\Delta R)^n = R^n(1+\Delta R/R)^n \approx R^n(1+n\Delta R/R) = R^n + nR^{n-1}\Delta R \qquad (3)$$

In other words, the reflectivity improves by n $R^{n-1}\Delta R$. It is, thus, advantageous to use mirrors of the present invention in an optical instrument comprising multiple mirrors.

Moreover, for periodic lengths less than 5 nm, it is preferable to polish an interface using an ion beam so that $\sigma_{int}-\sigma_{sub}$21 0.5 nm.

If the Bragg formula for fits-order reflection is combined with Equation (2), Equation (2) is transformed into Equation (4) below.

$$R/R_0 = \exp[-(290 \, \sigma/d)^2] \quad (4)$$

Equation (4) shows that the effect of interface roughness rapidly increases as the periodic length of a multi-layered film decreases. However, roughness caused during film growth can be lowered by ion beam polishing. The roughness resulting during actual film growth can be made less than or equal to 0.5 nm.

Figure 12:
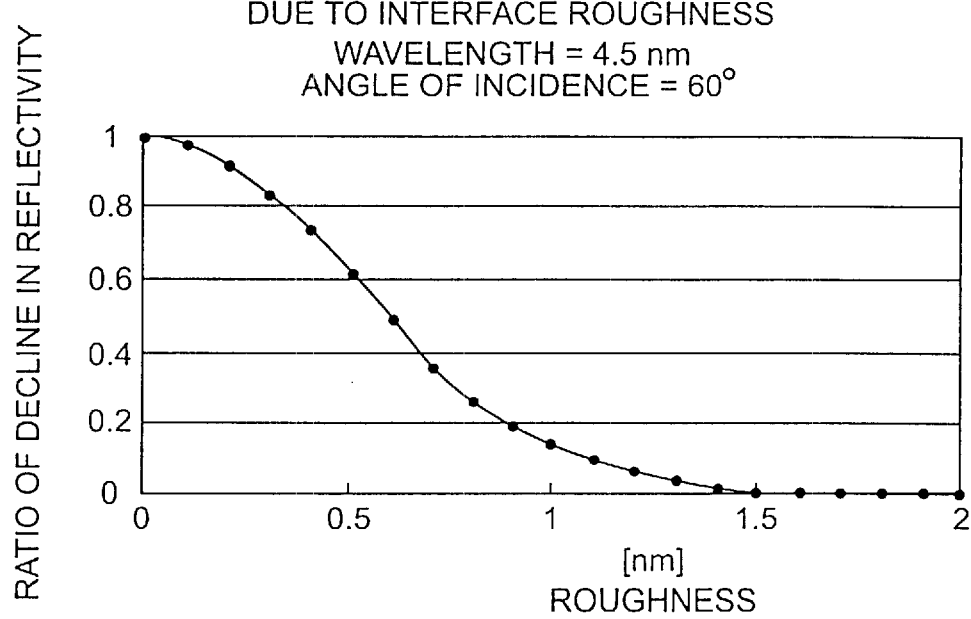
FIG. 12 is a graph that shows a ration of reflectivity decline and interface roughness for a multi-layered mirror with a period length less than 50 Å.

The periodic length for a multi-layered mirror model utilizing 60° angle of incidence and 4.5 nm wavelength equals 4.5 nm. The decrease of reflectivity due to interface roughness of this type of a multi-layered mirror is shown in the graph of FIG. 12. Even for the wavelength range of mirrors for which roughness improvement can not be anticipated due to a short periodic length, the reflectivity decrease ratio can be maintained at 50% by maintaining the RMS value of final interface roughness at 0.6 nm or below using ion beam polishing.

Moreover, this wavelength is known to be useable in the lab for soft X-rays, since this wavelength is characteristic of $CK\alpha$ X-rays. The film substances used to form a multi-layered mirror are nickel-chromium alloy and carbon.

The wavelength range of 2.4 nm to 4.4 nm, which is slightly shorter than that of $CK\alpha$ X-rays, is known as "water window," wherein proteins and water show a large difference in absorption coefficient. As a result, this wavelength range is used by X-ray microscopes for observation of biological samples.

In sum, the present invention improves a reflectivity by decreasing interface roughness using ion beam polishing. For an optical instrument that utilizes a number of such multi-layered mirrors, particularly an exposure apparatus such as one described below, its exposure treatment capacity improves due to an increased degree of exposure of a wafer.

Figure 13:
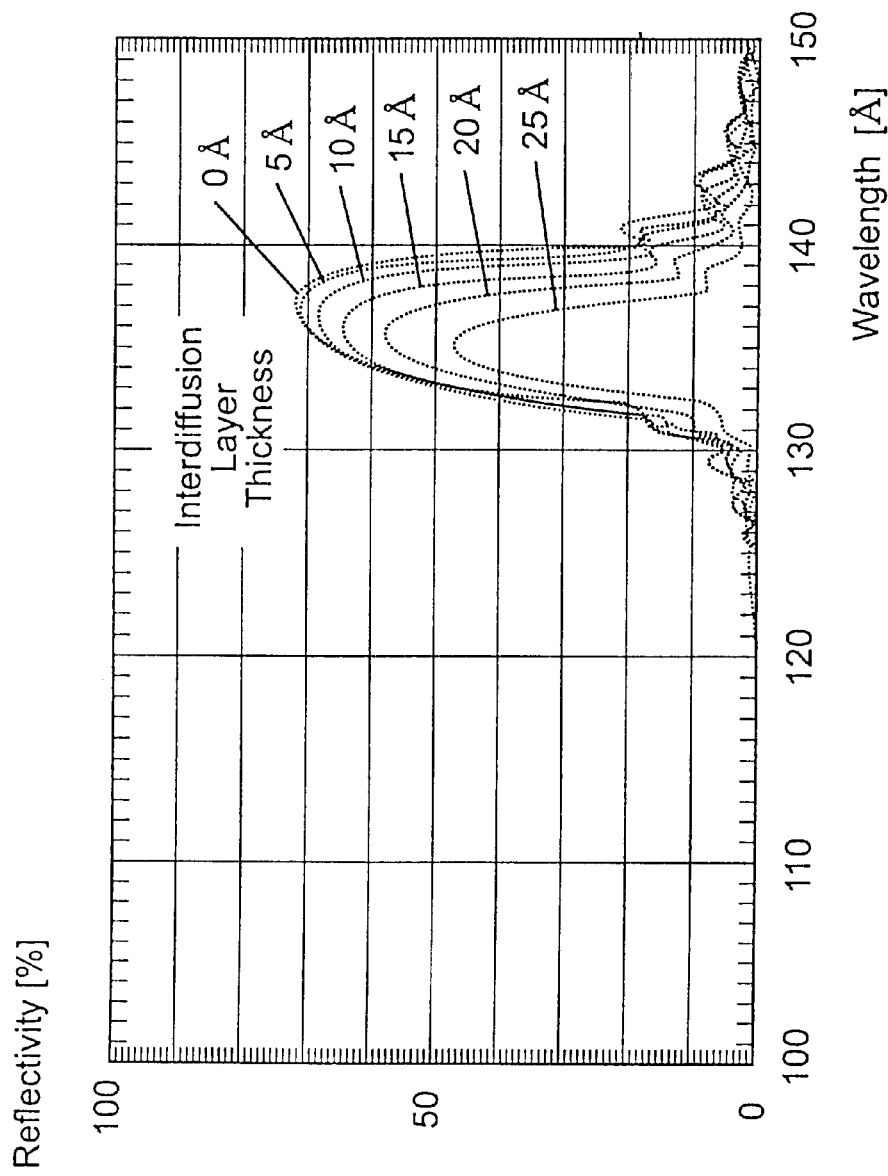
FIG. 13 is a diagram showing reflectivity characteristics versus wavelength at various thicknesses of an inter-diffusion layer.

An additional cause for decline in a reflectivity of a multi-layered mirror is the generation of an inter-diffusion layer as described above. Ion beam polishing can be used to decrease the generation of this inter-diffusion layer. Ion beam polishing is preferably carried out so that the formed diffusion layer is less than 1 nm. The graph of FIG. 13 shows reflectivity characteristics versus wavelength for various inter-diffusion layer thicknesses. Specifically, FIG. 13 shows variations of reflectivity characteristics with wavelength under the following conditions: multi-layered films formed from molybdenum and silicon, 7.5 nm periodic length, 50 pairs of layers, and 20° angle of incidence.

Although FIG. 13 shows variations of reflectivity characteristics with wavelength for various thicknesses of an inter-diffusion layer, as can be understood from the examination of FIG. 13, up to an inter-diffusion layer thickness of 1 nm, roughly 95% of the reflectivity can be obtained as would be expected for a multi-layered mirror with zero inter-diffusion layer. When an inter-diffusion layer thickness exceeds 1 nm, the reflectivity decline ratio becomes larger with respect to an increase in inter-diffusion layer thickness. Therefore, it is preferable obtain a multi-layered mirror with an inter-diffusion layer of around 1 nm.

An ion beam sputtering device in FIG. 9 is explained in detail below, along with one embodiment of a manufacturing method of the present invention using the ion beam sputtering device in FIG. 9.

The device in FIG. 9 is equipped with a sputtering ion source 101, a target h older mechanism 103, a substrate holder 107, and an ion polishing ion source 110 within a vacuum chamber 109.

Targets of at least two materials are mounted upon the target holder mechanism 103. The target holder mechanism 103 is equipped with a rotation mechanism that can move each target to a position facing the sputtering ion source 101.

Ion sources, such as a Kaufman-type ion source, a bucket-type ion source, or an ECR ion source, can be used as the sputtering ion source 101 and the ion polishing ion source 110.

Figure 9A:
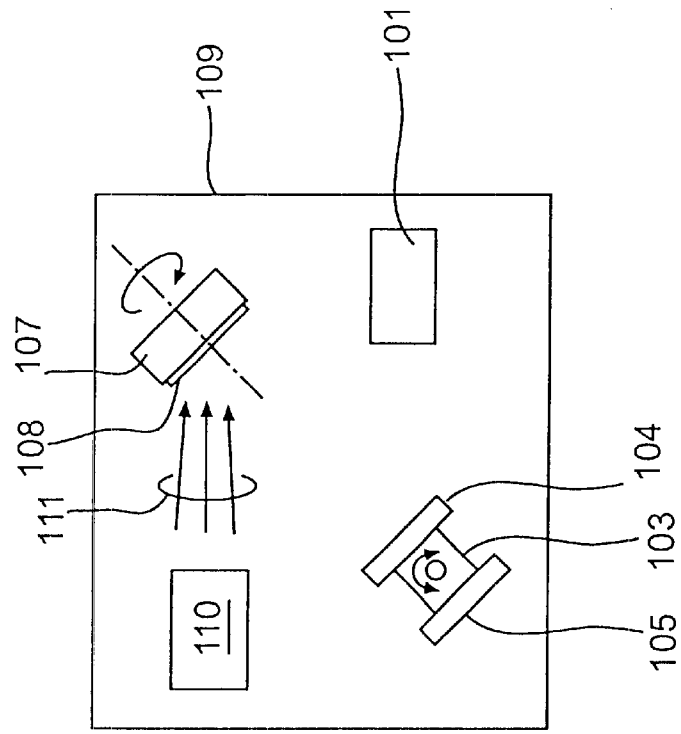
FIGS. 9(a) and 9(b) are drawings of one example of an ion beam sputtering device for forming films used in manufacturing a multi-layered mirror of the present invention.

As a multi-layered mirror is manufactured, inert gas ions 102 are first emitted by the sputtering ion source 101 as shown in FIG. 9(a). These inert gas ions 102 then strike a target 104 (or a target 105).

As inert gas ions 102 strike, atoms of the target 104 (or the target 105) are knocked away due to collision with ions, and an atomic-state vapor 106 is generated. The substrate holder 107, which carries a substrate 108, is positioned facing the target 104 (or the target 105). The vapor 106 attaches to the substrate 108, and a thin film layer (i.e. one of the thin films of which the alternating multi-layered film is comprised) is formed upon the substrate 108.

Figure 9B:
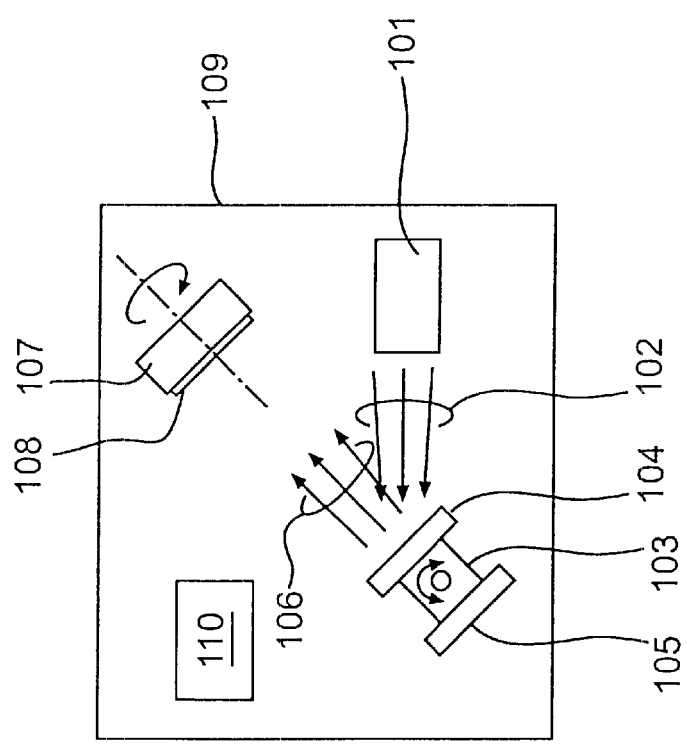

The substrate holder 107 is constructed so as to be rotatable in order to improve uniformity of the film thickness distribution Next, as shown in FIG. 9(b), inert gas ions 111 are emitted from the ion polishing ion source 110 and strike the substrate 108. The collision of the ions 111 with the surface of the thin film layer formed upon the substrate 108 smooths the surface of the thin film layer.

By rotating the target holder mechanism 103, the target 105 (or the target 104), that is different from one used previously, is directed toward the sputtering the ion source 101, and the other thin film layer of the alternately multi-layered film is formed.

By repeatedly performing these alternating processes, a multi-layered mirror is manufactured comprising a multi-layered film formed from several tens to several hundreds of layers upon a substrate.

Furthermore, ion beam polishing may be carried out for both of the constituent layers of the alternating multi-layered film, or alternatively, ion beam polishing may be carried out for just one type of layer.

Figure 14A:
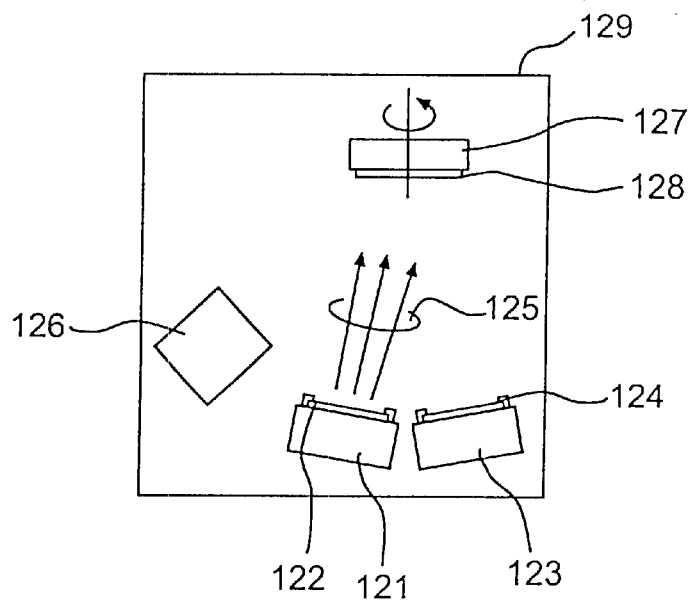
FIGS. 14(a) and 14(b) are drawings of one example of a magnetron sputtering device used as a film growth device in one embodiment of a manufacturing method of a multi-layered mirror of the present invention.
Figure 14B:
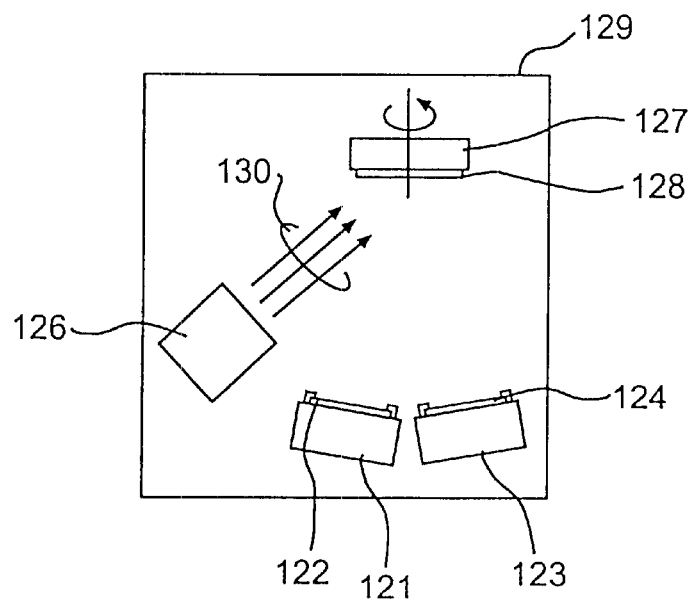

Next, a high frequency magnetron sputtering device shown in FIG. 14 is used as an example of a device that is used to manufacture a multi-layered film of the present invention. One embodiment of a manufacturing method of this invention is described in conjunction with the high frequency magnetron sputtering device in FIG. 14.

At least two high frequency magnetron sputtering sources 121 and 123, a substrate holder 127, and an ion polishing ion source 126 are provided within a vacuum chamber 129 of this device.

Targets 122, 124 are formed from different materials and are attached to the respective high frequency magnetron sputtering sources 121 and 123.

A sputtering source using DC current may be used in place of a high frequency magnetron sputtering source. A sputtering source, such as one using helicon waves, may also be used.

Various ion sources, such as a Kaufman-type ion source, a bucket-type ion source, and an ECR ion source, can be used as the ion polishing ion source 126.

When manufacturing a multi-layered mirror, inert gas (argon, etc.) is first fed into the vacuum chamber 129, as shown in FIG. 14(a). Voltage is applied to the high frequency sputtering source 121, and a plasma is generated by glow discharge directly upon the target 122.

Inert gas ions (not shown in FIG. 14) are generated within the plasma A self bias potential is generated between the plasma and target, and ions accelerated by this voltage gradient then strike the target 122.

Due to these collisions, atoms comprising the target 122 are knocked away, and atomic-state vapor 125 is generated. The substrate holder 127, which carries a substrate 128, is positioned facing the target 122. Vapor 125 attaches to the substrate 128, and a thin film layer (one of the thin films of which the alternating multi-layered film is comprised) is formed upon the substrate 128.

The substrate holder 127 is constructed so as to be rotatable in order to improve uniformity of the film thickness distribution.

Next, as shown in FIG. 14(*b*), inert gas ions 130 are emitted from the ion polishing ion source 126 and strike the substrate 128. The collision of ions 130 with the surface of the thin film layer formed upon the substrate 128 smooths the surface of the thin film layer.

Then voltage is applied to the high frequency magnetron sputtering source 123 that is different from one used previously, and the other thin film layer of the alternately multi-layered film is formed.

By repeatedly performing these alternating steps, a multi-layered mirror is manufactured comprising a multi-layered film formed from several tens to several hundreds of layers upon the substrate.

Furthermore, ion beam polishing may be carried out for both of the constituent layers of the alternating multi-layered film, or alternatively, ion beam polishing may be carried out for just one type of the layers.

Figure 15:
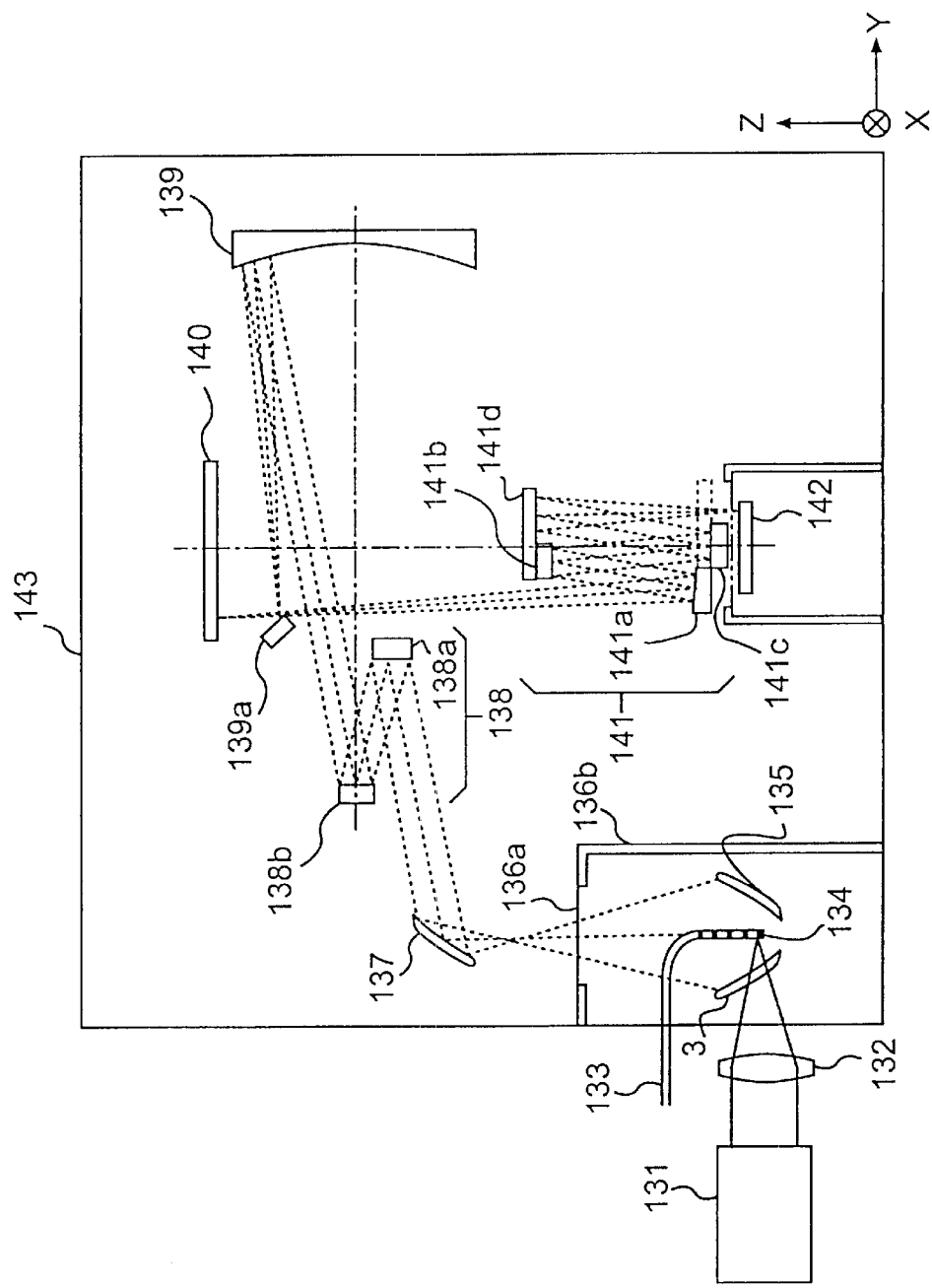
FIG. 15 shows an exposure apparatus that uses multi-layered mirrors of the present invention.

The multi-layered mirrors manufactured in this manner are used by an exposure apparatus shown in FIG. 15.

This exposure apparatus uses soft X-ray region light (EUV light) as illuminating light for exposure. Exposure operation is carried out by the step-and-scan method by a projection exposure device. Moreover, Within FIG. 15, the optical axis direction of the projection system that forms a reduced image of a mask 140 upon a wafer 142 is designated as the Z direction The Y direction is defined as the direction that is perpendicular to this Z direction and coincides with the drawing surface. The X direction is defined as perpendicular to these Y and Z directions and as perpendicular to the drawing surface.

This exposure apparatus uses the reflective mask 140 as the projection image source. While the image of a portion of a circuit pattern drawn upon the reflective mask 140 passes through a projection system 141 and then is projected upon the wafer 142 substrate, the mask 140 and the wafer 142 are moved one-dimensionally (i.e. Y axis direction in this case) relative to the projection system 141, thereby copying short regions one-by-one of the circuit pattern of the reflective mask 140 over the entire wafer 142.

Since the illumination light used for exposure is soft X-rays (referred to as EUV light below), atmospheric transparency of this illumination light is low. Therefore the light path traversed by EUV light is shielded from the external atmosphere by a vacuum chamber 143. A laser plasma X-ray source is used with a xenon target. This laser plasma X-ray source is equipped with chamber-external components that include an excitation light source (a laser light source 131 ), and a condenser optical system 132. This laser plasma X-ray source is also equipped with chamber-external components that include a vacuum chamber 136*b* and a window 136*a*. The external components are placed facing the window 136*a* into the vacuum chamber 136*b*. In particular, the laser plasma X-ray source must be placed in a vacuum container separate from the vacuum chamber 143 since debris is generated from the nozzle that emits xenon gas.

The illumination system of the exposure apparatus is explained below as one preferred embodiment of the present invention.

The laser light source 131 emits laser light in the infrared to visible wavelength region. Examples of a laser used as the laser light source 131 include a semiconductor laser-activated YAG laser, excimer laser, etc. This laser light is concentrated at a position 134 by the condenser optical system 132, and illuminates xenon gas emitted from a nozzle 133 toward the position 134. The emitted xenon gas at the position 134 undergoes high intensity laser light illumination. Illumnination of the xenon gas by laser light excites the xenon gas into a plasma state due to energy of the laser light EUV light is emitted during transition from this excited state to a low potential state.

An ellipsoidal mirror 135 is placed at the periphery of the position 134 and is a constituent part of a condenser optical system. The ellipsoidal mirror 135 is positioned so that a first focal point nearly coincides with the position 134. The interior surface of the ellipsoidal mirror 35 is provided with the previously mentioned multi-layered film so as to reflect EUV light. Therefore, the EUV light reflected from the ellipsoidal mirror 135 passes through the window 136*a* of the vacuum chamber and becomes concentrated once at a second focal point of the ellipsoidal mirror 135, then strikes a paraboloidal mirror 137, which is used as a collimation mirror. The paraboloidal mirror 137 is positioned so that its focal point nearly coincides with the second focal point location of the ellipsoidal mirror 134. The interior surface of the paraboloidal mirror 137 is formed from a multi-layered film so as to reflect EUV light.

In a nearly collimated state, EUV light reflected from the paraboloidal mirror 137 then enters a reflective fly's-eye optical system 138, which is used as an optical integrator. The reflective fly's-eye optical system 138 comprises multiple reflective surfaces (multiple mirror elements) of a first reflective element group 138*a* and a second reflective element group 138*b* (with multiple reflective surfaces that correspond to the opposing multiple surfaces of the first reflective element group 138*a*). Multi-layered films are formed upon the multiple reflective surfaces that comprise the upper surfaces of the reflective element groups 138*a* and 138*b* so as to reflect EUW light.

Collimated EUV light reflected from the paraboloidal mirror 137 undergoes wave front splitting due to the first reflective element group 138*a*. EUV light is concentrated from the various reflective surfaces to form multiple light source images. The multiple reflective surfaces of the second reflective element group 138*b* are positioned so that these reflective surfaces substantially perform the function of field mirrors close to the positions where each respective image of these multiple light source images is formed. In this manner, the reflective fly's-eye optical system 138 uses the nearly parallel light beam from the paraboloidal mirror 137 to form a two-dimensional light source as multiple light source images. This type of the reflective fly's-eye optical system 138 is proposed in Japanese Patent Application No. 10-47400 by the present inventors.

EUV light from the two-dimensional light source formed by the reflective fly's-eye optical system 138 strikes the condenser mirror 139, which has a focal point location positioned near the two-dimensional light source. After reflected light from the condenser mirror 139 is concentrated, this light arrives upon the reflective mask 140 after reflecting off an optical path deflection mirror 139*a*. In order to reflect EUV light, EUV light reflecting multi-layered films are provided upon the surfaces of the condenser mirror 139 and the optical path deflection mirror 139a. A condenser mirror 139 collects EUV light emitted from the two-dimensional light source and then uniformly and satisfactorily illuminates a certain illumination region upon the reflective mask 140.

In this preferred embodiment, to spatially separate a light path of the illuminating light directed toward the reflective mask 140 and that of the exposure light reflected from the mask 140 and directed toward the projection optical system 141, the illumination system is a non-telecentric optical system. The projection optical system 141 also is a mask-side non-telecentric optical system.

A reflective film is provided upon the reflective mask 140 comprising a multi-layered film that reflects BUV light. This reflective film pattern corresponds to the pattern that should be copied upon the wafer 142. The EUV light that contains pattern information reflected by the mask 140 then enters the projection optical system 141.

The projection optical system 141 of this preferred embodiment is constructed from four mirrors: a first mirror 141a with a concave surface, a second mirror 141b with a convex surface, a third mirror 141c with a convex surface, and a fourth mirror 141d with a concave surface. Each mirror 141a–141d is formed as an EUV light reflecting multi-layered film upon a substrate. These mirrors are placed so that their respective optical axes coincide.

Furthermore, the first mirror 141a, the second mirror 141b, and the fourth mirror are trimmed so that none of the mirrors 141a–141d blocks the back-and-forth optical path. An aperture stop (not shown in FIG. 15) is provided at the third mirror 141c position.

EUV light reflected from the mask 40 is reflected in turn by the first mirror 141a through the fourth mirror 141d, then forms a reduced image of the mask 140 pattern within the exposure region upon the wafer 142 at a certain magnification $\beta$ (for example, $\beta=¼$, $⅕$, or $⅙$). This projection optical system 141 is constructed so that the image side (the wafer 142 side) becomes telecentric.

Although not shown in the FIG. 15, the mask 140 is supported by at least one reticle stage that is movable along the Y direction, and the wafer 142 is supported by a wafer stage (a substrate stage) that is movable along three (X, Y, and Z) directions. During the exposure operation, the reflective mask 140 and the wafer 142 are moved relative to the projection system 141 at a certain speed ratio determined by the reduction magnification of the projection system 141. As a result, scanning exposure of the reflective mask 140 pattern takes place within a certain shot region upon the wafer 142.

By using multi-layered mirrors with controlled interface roughness and/or inter-diffusion layer thickness in an exposure apparatus similar to the one explained above, one can obtain an exposure apparatus that efficiently uses light obtained by the laser plasma X-ray source to illuminate the wafer 142. In particular, this type of exposure apparatus (including the reflective mask) utilizes eleven multi-layered mirrors to illuminate the wafer 142.

Therefore when the reflectivity of each mirror decreases by 8% from the desired value, if the desired value is taken to be 73%, the resultant intensity of illumination upon the wafer is only 40% of that obtained using mirrors of the desired value. The present invention avoids lowering of reflectivities of each mirror used by an optical instrument by decreasing surface roughness and inter-layer diffusion. An optical instrument that uses multi-layered mirrors of the present invention achieves a remarkably higher light-use efficiency.

Below, embodiments or working examples of the present invention are described in greater detail. These examples are intended to be purely exemplary of the invention.

WORKING EXAMPLE 1

Figure 4:
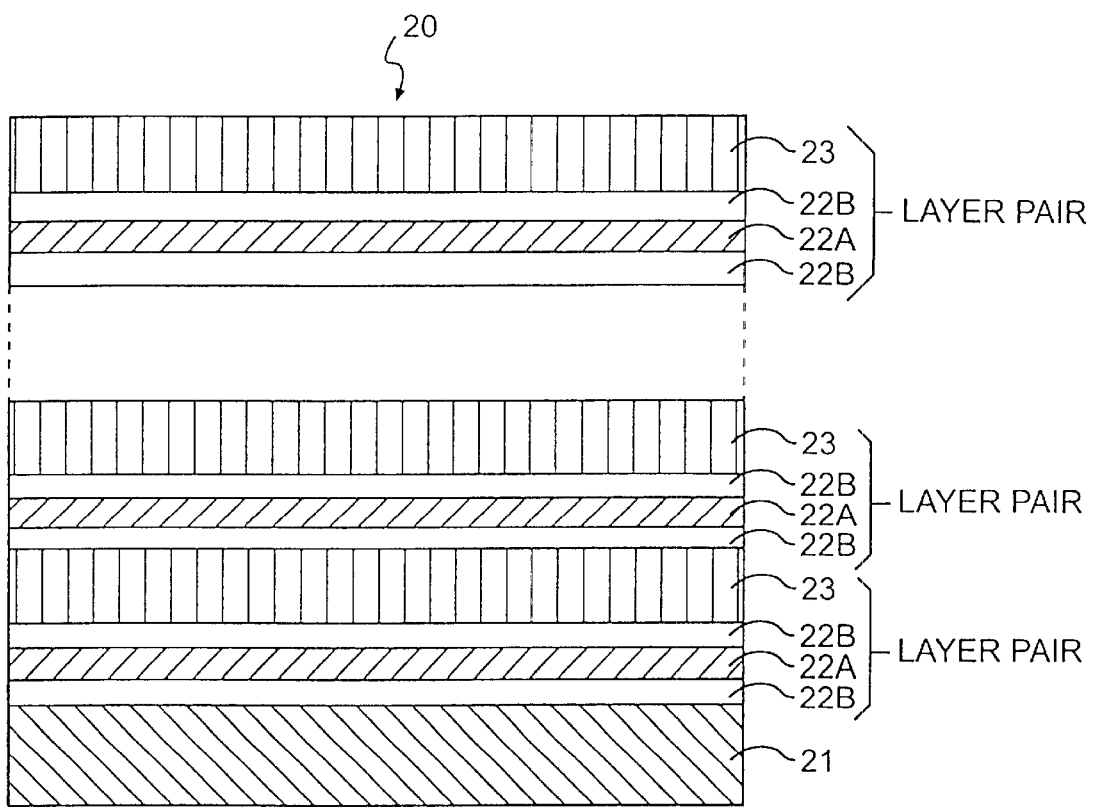
FIG. 4 is a cross-sectional drawing of a first embodiment of a multi-layered mirror of the present invention described in Working Example 1.

FIG. 4 is a cross-sectional drawing showing a Working Example 1 multi-layered mirror 20. This multi-layered mirror 20 was formed by ion beam sputtering and multiple layers of Mo 22A, Si 23A, and Ru 22B. A single heavy atom layer was formed using a single Mo layer 22A and two Ru layers 22B. The Mo layer 22A was sandwiched between the two Ru layers 22B. A single opposing pair of layers included the Si layer 23 (light atom layer) and the Ru—Mo—Ru layer heavy atom layer). Furthermore, the number of layers in this example was 50 pairs. The layer thicknesses of Mo layer 22A, Ru layer 22B and Si layer 23 were 5 Å, 10 Å, and 48.8 Å, respectively. The thickness of the heavy atom layer was 25 Å, and the thickness of the light atom layer was 48.8 Å, and the periodic length was 73.8 Å. A 3 inch diameter, roughly 380 µm thick Si wafer was used as the Si substrate 21. Internal stress within the manufactured multi-layered mirror 20 was roughly 196 MPa (compressive stress), and the degree of bow deformation of the substrate 21 was about 10 µm. In contrast to this, a Mo/Si multi-layered mirror with 50 pairs of layers (comprising 25 Å thick Mo layers and 48.8 Å thick Si layers) had an internal stress of 306 MPa (compressive stress) and about 16 µm bow deformation of the substrate. In comparison to a Mo/Si multi-layered mirror with the equivalent periodic length, the multi-layered mirror 20 of Working Example 1 decreased internal stress of the multi-layered film and decreased bow deformation.

Moreover, soft X-rays were used to measure the perpendicular incidence reflectivity of the multi-layered mirror 20. No difference was found at 13 nm wavelength when compared to the above mentioned Mo/Si multi-layered mirror lacking a Ru layer.

A glass substrate was used as the multi-layered mirror substrate of the reflective optical system of an exposure apparatus using soft X-rays. The permissible degree of deformation of these multi-layered mirrors was of the order of 1 to 10 nm. Whether the internal stress was above or below 100 MPa was the criterion for whether the resultant deformation was permissible.

WORKING EXAMPLE 2

Figure 5:
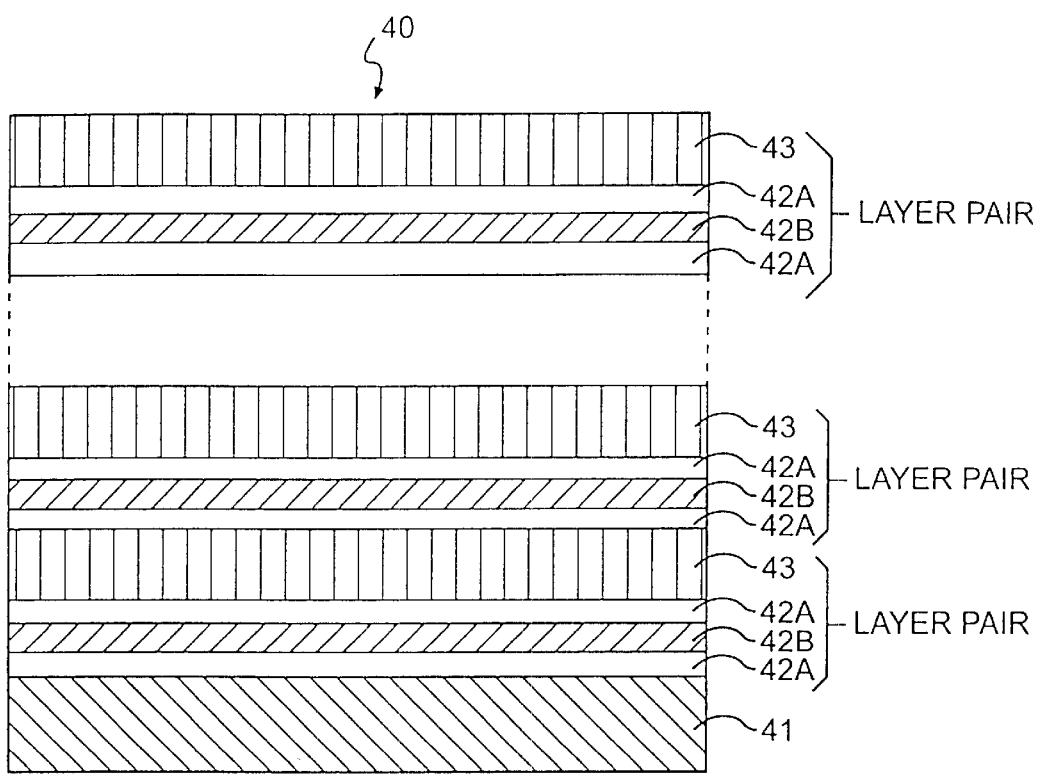
FIG. 5 is a cross-sectional drawing of a second embodiment of a multi-layered mirror of the present invention described in Working Example 2.

A multi-layered mirror 40 in FIG. 5 was formed by ion beam sputtering. The multi-layered mirror 40 included Mo, Si, and Ru layers, forming a multi-layered film upon a Si substrate 41. In comparison to the above mentioned multi-layered mirror 20 in Working Example 1, the multi-layered mirror 40 had a reversed order of layers: a heavy atom layer comprised a single Ru layer 42B formed between two Mo layers 42A. The number of layers was 50 pairs.

The thicknesses of the Mo layer 42A, the Ru layer 42B and the Si layer 43 were 7.5 Å, 10 Å, and 49.4 Å, respectfully. The thickness of the heavy atom layer was 25 Å, and the thickness of the light atom layer was 49.4 Å, and the periodic length was 74.4 Å. A 3 inch diameter, roughly 380 µm thick Si wafer was used as the Si substrate 41 in the same manner as the above mentioned Si substrate 21. Internal stress within the manufactured multi-layered mirror 40 was roughly 196 MPa (compressive stress), and the degree of bow deformation of the substrate 41 was about 13 µm. In contrast, a Mo/Si multi-layered mirror with a fifty pair of layers (comprising 25 Å thick Mo layers and 49.4 Å thick Si layers) had an internal stress of 306 MPa (compressive stress) and about 16 µm bow deformation of the substrate.

Moreover, soft X-rays were used to measure the perpendicular incidence reflectivity of the multi-layered mirror 40. No difference in reflectivity was found at 13 nm wavelength when compared to the above mentioned Mo/Si multi-layered mirror lacking the Ru layer.

WORKING EXAMPLE 3

Figure 6:
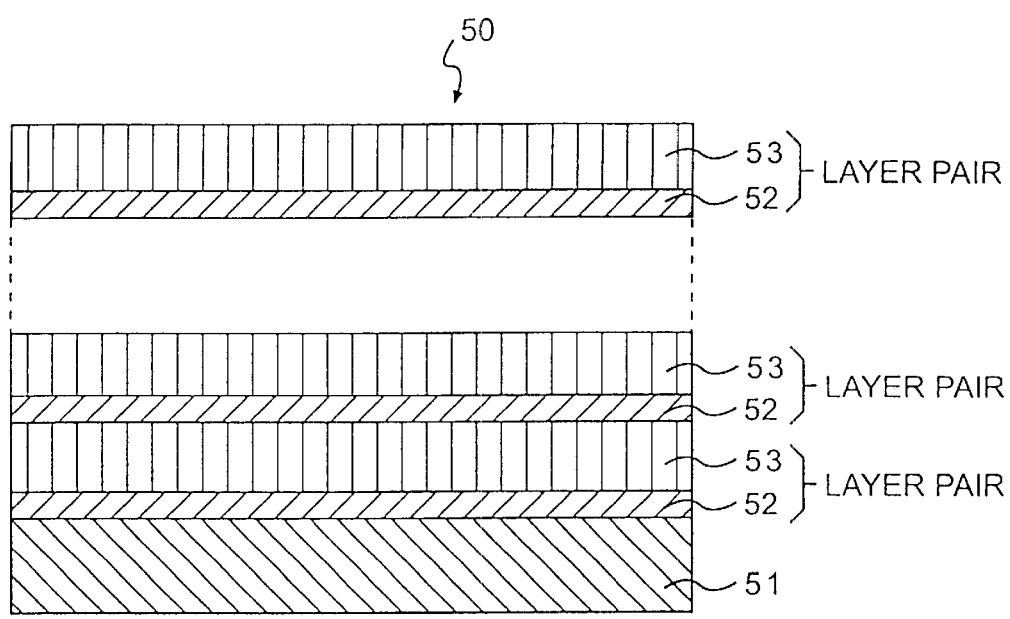
FIG. 6 is a cross-sectional drawing of a third embodiment of a multi-layered mirror of the present invention described in Working Example 3.

A multi-layered mirror 50 in FIG. 6 was formed by ion beam sputtering. The multi-layered mirror 50 included Mo and Si layers forming a multi-layered film upon a Si substrate 51. Prior to formation of a Si layer 53 upon an Mo layer 52, the Mo layer 52 was irradiated by an Ar ion beam. Ion beam of 600 eV in beam energy was irradiated at 80° irradiation angle with respect to normal for seven seconds. The periodic length of the multi-layered film was 77.0 Å (the thicknesses of the Mo layer 52 and the Si layer 53 were 25.0 Å and 52.0 Å, respectively). The number of layers was fifty pairs. Furthermore, a 3 inch diameter, roughly 380 μm thick Si wafer was used as the Si substrate 51.

Internal stress of the multi-layered mirror 50 was 138 MPa (compressive stress), and the degree of bow deformation of the substrate 51 was about 7.4 μm. In contrast, a Mo/Si multi-layered mirror without ion beam irradiation (with the same Mo layer thickness, the same Si layer thickness, and the same number of layer pairs as the multi-layered mirror 50) had an internal stress of 306 MPa (compressive stress) and about 16 μm bow deformation of the substrate.

Moreover, soft X-rays were used to measure the perpendicular incidence reflectivity of the multi-layered mirror 50. No difference in reflectivity was found at 13 nm wavelength in comparison a Mo/Si multi-layered mirror without ion beam irradiation treatment.

WORKING EXAMPLE 4

Figure 7:
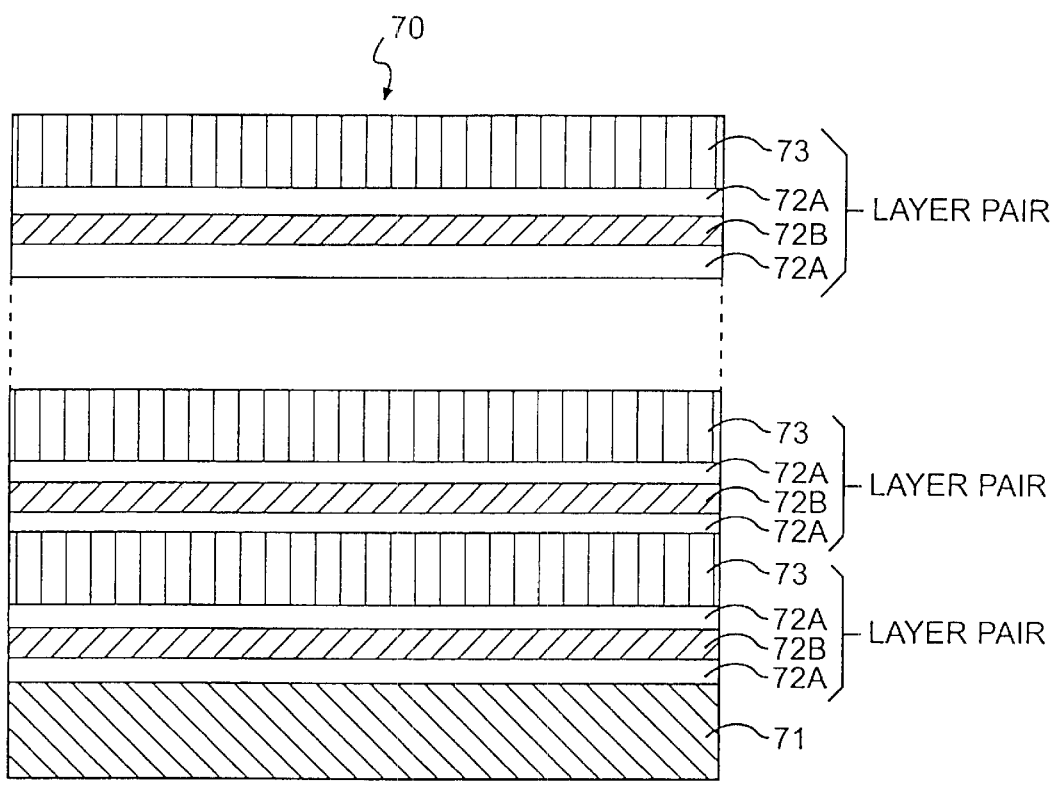
FIG. 7 is a cross-sectional drawing of a fourth embodiment of a multi-layered mirror of the present invention described in Working Example 4.

A multi-layered mirror 70 in FIG. 7 was formed by ion beam sputtering. As in the multi-layered mirror 40, a single heavy atom layer included a single Ru layer 72B between two Mo layers 72A. The number of layers was fifty pairs. Prior to forming the Ru layer 72B or the Si layer 73 upon the Mo layer 72A, the Mo layer 72 surface was irradiated by an Ar ion beam. Ion beam of 600 eV in beam energy was irradiated at 80° irradiation angle with respect to normal for seven seconds.

The periodic length of the multi-layered film was 72.5 Å (The thicknesses of the Mo layer 72A, the Ru layer 72B, and the Si layer 73 were 7.5 Å, 10 Å, and 47.5 Å, respectively). The number of layer pairs was fifty. Furthermore, a Si wafer that is 3 inches in diameter, roughly 380 μm thick was used as a Si substrate 71. Internal stress of the multi-layered mirror 70 was about 75 MPa (compressive stress), and the degree of bow deformation of the substrate 71 was about 3.8 μm. In contrast, a fifty pair Mo/Si multi-layered mirror (25 Å thick Mo layer, 47.5 Å thick Si layer) without ion beam irradiation had an internal stress of 306 MPa (compressive stress) and about 16 μm bow deformation of the substrate. Thus, internal stress was markedly reduced when the Ru layer 72B was formed and the above mentioned ion beam irradiation was used.

WORKING EXAMPLE 5

An ion beam sputtering device shown in FIG. 9 was used to form a Ni/Fi alternatingly multi-layered film upon a substrate, thereby producing a multi-layered mirror for reflection of neutrons.

A silicon polished substrate (100 mm×10 mm×5 mm dimensions) was used as a substrate. The periodic length of the alternatingly multi-layered film was 2.5 nm and the layer count was 300 pairs.

Ion beam polishing was carried out each time after a Ni layer was formed and prior to the formation of a Ti layer. Ar ions accelerated to 100 eV were used for ion beam polishing. The angle of incidence relative to normal was 80°.

When the X-ray reflectivity of the multi-layered mirror produced in this manner was measured at the characteristic X-ray wavelength of CuKα (0.154 nm), its reflectivity was roughly thirty times higher than that of a Ni/Ti alternatingly multi-layered film mirror without ion beam polishing.

When its neutron reflectivity was measured, its neutron reflectivity was 8 times higher than that of a Ni/Ti alternatingly multi-layered film mirror without ion beam polishing.

It is known that as the period length shortens the Ni layer island-shaped structure of a Ni/Ti alternatingly multi-layered film becomes severe, the interface roughness increases, and reflectivity greatly deteriorates. Although mixing of C into the Ni layer has been proposed as a method to solve this problem (Japanese Unexamined Patent Application No. Hei 4-232900), the mixture of C into the Ni layer was found to increase neutron reflectivity by no more than several tens of percent. Therefore, it was confirmed that the present invention is extremely advantageous for a Ni/Ti alternatingly multi-layered film mirror.

WORKING EXAMPLE 6

The ion beam sputtering device shown in FIG. 9 was used to form a Ni/C alternatingly multi-layered film upon a substrate, thereby producing a multi-layered mirror for reflecting X-rays whose wavelength is around 5 nm.

A 3 inch silicon wafer was used as a substrate. Furthermore, the periodic length of the alternatingly multi-layered film was 3 nm, and the layer count was 100 pairs.

Ion beam polishing was carried out each time after a Ni layer was formed and prior to the formation of a C layer. Ar ions accelerated to 300 eV were used for ion beam polishing. The angle of incidence relative to normal was 70°.

When the X-ray reflectivity of the multi-layered mirror produced in this manner was measured at the characteristic X-ray wavelength of CuKα (0.154 nm), its reflectivity was roughly twenty times higher than that of a Ni/C alternatingly multi-layered film mirror without ion beam polishing. Moreover, when the X-ray reflectivity was measured at 5 nm wavelength, its reflectivity was about 5 times higher than that of a Ni/C alternatingly multi-layered film mirror without ion beam polishing.

WORKING EXAMPLE 7

The high frequency sputtering device shown in FIG. 14 was used to form a Mo/Si alternatingly multi-layered film upon a substrate, thereby producing a multi-layered mirror for reflection of soft X-rays for use in a soft-X-ray reducing projection exposure apparatus.

A polished quartz substrate (300 mm diameter) was used as a substrate. Furthermore, the periodic length of the alternatingly multi-layered film was 6.7 nm and the layer count was 50 pairs.

Ion beam polishing was carried out each time after a Mo layer was formed and each time after a Si layer was formed. Xe ions were used for ion beam polishing. For the Mo layer, these Xe ions were accelerated to 500 eV, and the angle of incidence relative to normal was 45°. For the Si layer, these Xe ions were accelerated to 250 eV, and the angle of incidence relative to normal was 30°.

When the X-ray reflectivity of the multi-layered mirror produced in this manner was measured using 13 nm wavelength soft X-rays, its reflectivity was 5% higher than a Mo/Si alternatingly multi-layered film mirror without ion beam polishing. Although this increase in reflectivity was small, even a small reflectivity increase is important for increasing throughput of an exposure apparatus that utilizes multiple multi-layered mirrors in a soft X-ray reducing projection exposure apparatus.

WORKING EXAMPLE 8

The ion beam sputtering device shown in FIG. 9 was used to form a NiCr/V$_2$O$_5$ alternatingly multi-layered film upon a substrate, thereby producing a multi-layered mirror for use by an X-ray microscope for observation of biological organisms. A silicon carbide polished wafer (80 mm diameter) was used as a substrate. Furthermore, the periodic length of the alternatingly multi-layered film was 2.2 nm, and the layer count was 200 pairs.

Ion beam polishing was carried out each time after a NiCr layer was formed and each time after the V$_2$O$_5$ layer was formed. Ar ions were used for ion beam polishing. For the NiCr layer, a Ar ions were accelerated to 80 eV, and the angle of incidence relative to normal was 80°. For the V$_2$O$_5$ layer, Ar ions were accelerated to 450 eV, and the angle of incidence relative to normal was 50°.

When the X-ray reflectivity of the multi-layered mirror produced in this manner was measured at the characteristic X-ray wavelength of CuKα (0.154 nm), reflectivity was roughly 40 times higher than that of a NiCrN$_2$O$_5$ alternatingly multi-layered film mirror without ion beam polishing when X-ray reflectivity was measured at 3.8 nm wavelength, its reflectivity was obtained that was about 10 times higher than that of a NiCr/V$_2$O$_5$ alternatingly multi-layered film mirror without ion beam polishing.

WORKING EXAMPLE 9

The high frequency sputtering device shown in FIG. 14 was used to form a Mo/B$_4$C alternatingly multi-layered film upon a substrate, thereby producing a multi-layered mirror for reflection of X-rays in the vicinity of 7 nm.

A 3 inch diameter silicon wafer was used as a substrate. Furthermore, the periodic length of the alternatingly multi-layered film was 4 nm, and the layer count was 150 pairs.

Ion beam polishing was carried out each time after a Mo layer was formed and before a B$_4$C layer was formed. Kr ions were used for ion beam polishing. These Kr ions were accelerated to 700 eV, and the angle of incidence relative to normal was 20°.

When the X-ray reflectivity of the multi-layered mirror produced in this manner was measured at the characteristic X-ray wavelength of CuKα (0.154 nm), its reflectivity was roughly two times higher than that of a Mo/B$_4$C alternatingly multi-layered film mirror without ion beam polishing. When soft X-ray reflectivity was measured at 7 nm wavelength, a reflectivity was about 3 times higher than that of a Mo/B$_4$C alternatingly multi-layered film mirror without ion beam polishing.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

TABLE 1

| Utilized Wavelength | | Substance | δ | k |
|---|---|---|---|---|
| 13 nm | large δ substances | Mo (molybdenum) | 0.075498 | 0.006405 |
| | | Tc (technetium) | 0.09119 | 0.009211 |
| | | Ru (ruthenium) | 0.101605 | 0.013313 |
| | | Rh (rhodium) | 0.116411 | 0.023958 |
| | small δ substances | Si (silicon) | −0.00096 | 0.001585 |
| | | Ba (barium) | −0.02138 | 0.024384 |
| | | SiC (silicon carbide) | 0.01468 | 0.004218 |
| 10.9 nm | large δ substances | Mo (molybdenum) | 0.047719 | 0.003862 |
| | | Tc (technetium) | 0.057369 | 0.004664 |
| | | Ru (ruthenium) | 0.063472 | 0.005434 |
| | | Rh (rhodium) | 0.071476 | 0.006872 |
| | small δ substances | SrB$_6$ (strontium boride) | 0.016952 | 0.002028 |
| | | Y (yttrium) | 0.016108 | 0.001908 |
| | | Si (silicon) | −0.0036 | 0.014067 |

TABLE 2

| No. | Angle of Incidence of Particle Beam Relative to Perpendicular to Film Interface | Irradiation Time Period | Periodic Length* | Film Stress After Irradiation | Type of Stress |
|---|---|---|---|---|---|
| 1 | 0 degrees | 2 seconds | 66.0 Å | 48 MPa | tensile |
| 2 | 35 degrees | 3 seconds | 66.6 Å | 14 MPa | tensile |
| 3 | 53 degrees | 4 seconds | 64.5 Å | 4 MPa | compressive |
| 4 | 61 degrees | 5 seconds | 65.1 Å | 26 MPa | compressive |

(*All heavy atom layers were 23 Å thick.)

What is claimed is:

1. A multi-layered mirror comprising:

a substrate;

at least one first layer of a first substance with a small refractive index; and at least one second layer of a second substance with a large refractive index, wherein the at least one first layer and the at least one second layer are alternately laminated on the substrate by sputtering, and wherein an interface between the at least one first and the at least one second layers of the multi-layered mirror has been irradiated by an ion beam and smoothed so that for d>5 nm, $\sigma_{int}-\sigma_{sub}<0.2$ nm, and for d<5 nm, $\sigma_{int}-\sigma_{sub}<0.5$ nm, where d is a periodic length defined as a sum of the first substance layer thickness and the second substance layer thickness, $\sigma_{sub}$ is an RMS value of surface roughness of the substrate, and $\sigma_{int}$ is an RMS value of roughness of the interface.

2. The multi-layered mirror according to claim 1, wherein a region over which the first substance of the first layer and the second substance of an adjacent second layer diffuse into each other is less than or equal to 1 nm.

3. A multi-layered mirror comprising:

a substrate;

at least one first layer of a first substance with a small refractive index; and at least one second layer of a second substance with a large refractive index, wherein the at least one first layer and the at least one second layer are alternately laminated on the substrate by sputtering, wherein an interface between the first layer and the second layer is smoothed so that a region over which the first substance of the first layer and the second substance of an adjacent second layer diffuse into each other is less than or equal to 1 nm, and wherein the interface is smoothed so that for d>5 nm, $\sigma_{int}-\sigma_{sub}<0.2$ nm, and for d<5 nM, $\sigma_{int}-\sigma_{sub}<0.5$ nm, where d is a periodic length defined as a sum of the first substance layer thickness and the second substance layer thickness, $\sigma_{sub}$ is an RMS value of surface roughness of the substrate, and $\sigma_{int}$ is an RMS value of roughness of the interface.

4. A multi-layered mirror comprising;

a substrate;

a first layer of a first substance formed on the substrate by sputtering;

a second layer of a second substance formed on the first layer by sputtering;

a third layer of the first substance formed on the second layer by sputtering; and a fourth layer of the second substance formed on the third layer by sputtering, wherein a refractive index of the first substance is different from that of the second substance, and wherein at least one interface between two adjacent layers has been irradiated by an ion beam and smoothed so that for d>5 nM, $\sigma_{int}-\sigma_{sub}<0.2$ nm, and for d<5 nm, $\sigma_{int}-\sigma_{sub}<0.5$ nm, where d is a periodic length defined as a sum of the first substance layer thickness and the second substance layer thickness, $\sigma_{sub}$ is an RMS value of surface roughness of the substrate, and $\sigma_{int}$ is an RMS value of roughness of the interface.

5. The multi-layered mirror according to claim 4, wherein the first substance is molybdenum and the second substance is silicon.

6. The multi-layered mirror according to claim 4, wherein the first substance is silicon and the second substance is molybdenum.

7. The multi-layered mirror according to claim 4, wherein a region over which the first substance of the first layer and the second substance of an adjacent second layer diffuse into each other is less than or equal to 1 nm.

8. A method for manufacturing a multi-layered mirror upon a substrate comprising:

alternatively laminating by sputtering upon the substrate a first layer of a first substance with a small refractive index and a second layer of a second substance with a large refractive index; and smoothing at least one of the first or the second layer by irradiation using an ion beam prior to forming another layer on top of that layer, wherein the at least one of the first or the second layer is smoothed so that for d>5 nm, $\sigma_{int}-\sigma sub<0.2$ nm, and for d<5 nm, $\sigma_{int}-\sigma_{sub}<0.5$ nm, where d is a periodic length defined as a sum of the first substance layer thickness and the second substance layer thickness, $\sigma_{sub}$ is an RMS value of surface roughness of the substrate, and $\sigma_{int}$ is an RMS value of roughness of an interface between adjacent ones of at least one of the first and at least one of the second layers.

9. The method according to claim 8, wherein an ion type of the ion beam used in the smoothing step is an inert gas.

10. The method claim according to claim 9, wherein the substrate is either electrically grounded or a DC bias voltage is imparted to the substrate.

11. The method claim according to claim 9, wherein the energy of the ion beam used in the smoothing step is greater than 50 eV and less than 1000 eV.

12. The method claim according to claim 11, wherein the substrate is either electrically grounded or a DC bias voltage is imparted to the substrate.

13. The method according to claim 8, wherein energy of the ion beam used in the smoothing step is greater than 50 eV and less than 1000 eV.

14. The method claim according to claim 8, wherein the substrate is either electrically grounded or a DC bias voltage is imparted to the substrate.

15. The method claim according to claim 13, wherein the substrate is either electrically grounded or a DC bias voltage is imparted to the substrate.

* * * * *